United States Patent
Yamane et al.

(10) Patent No.: US 10,529,917 B2
(45) Date of Patent: Jan. 7, 2020

(54) HIGH ENERGY BARRIER PERPENDICULAR MAGNETIC TUNNEL JUNCTION ELEMENT WITH REDUCED TEMPERATURE SENSITIVITY

(71) Applicant: GLOBALFOUNDRIES Singapore Pte. Ltd., Singapore (SG)

(72) Inventors: Kazutaka Yamane, Singapore (SG); Seungmo Noh, Singapore (SG); Kangho Lee, Singapore (SG); Vinayak Bharat Naik, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/712,109

(22) Filed: Sep. 21, 2017

(65) Prior Publication Data

US 2018/0123027 A1    May 3, 2018

Related U.S. Application Data

(60) Provisional application No. 62/416,719, filed on Nov. 3, 2016.

(51) Int. Cl.
*H01L 43/08* (2006.01)
*H01L 43/12* (2006.01)
(Continued)

(52) U.S. Cl.
CPC ............ *H01L 43/08* (2013.01); *G11C 11/161* (2013.01); *H01L 27/228* (2013.01); *H01L 43/02* (2013.01); *H01L 43/10* (2013.01); *H01L 43/12* (2013.01)

(58) Field of Classification Search
None
See application file for complete search history.

(56) References Cited

U.S. PATENT DOCUMENTS 6,721,141 B1 *  4/2004  Attenborough ........ B82Y 10/00
                                                257/E43.004
2017/0104029 A1 *  4/2017  Li ........................ H01L 27/228
(Continued)

OTHER PUBLICATIONS

A.Conca et al., Annealing influence on the Gilbert damping parameter and the exchange constant of CoFeB thin films, Applied Physics Letter, 2014, pp. 182407(1-4), vol. 18, Issue 18, AIP Publishing.
(Continued)

*Primary Examiner* — Long Pham
(74) *Attorney, Agent, or Firm* — Thompson Hine LLP

(57) ABSTRACT

A magnetic tunneling junction (MTJ) with a free layer that is less temperature sensitive and is reflow compatible at 260° C. The magnetic free layer may include various configurations, such as a single as-deposited crystalline magnetic layer or a composite free layer with more than one magnetic layers or a combination of composite and single magnetic layers. The layers of the composite magnetic free layer may include as-deposited crystalline magnetic free layers or a combination of as-deposited crystalline and as-deposited amorphous magnetic layers, with or without a spacer layer. An interface layer may be provided at an interface between the free layer and adjacent layer to apply tensile stress on the free layer in the direction perpendicular to the in-plane direction to enhance perpendicular magnetic anisotropy (PMA) of the free layer.

6 Claims, 18 Drawing Sheets

(51) Int. Cl.
  *G11C 11/16* (2006.01)
  *H01L 43/10* (2006.01)
  *H01L 27/22* (2006.01)
  *H01L 43/02* (2006.01)

(56) References Cited

U.S. PATENT DOCUMENTS

| | | | |
|---|---|---|---|
| 2017/0162782 A1* | 6/2017 | Annunziata | H01L 43/02 |
| 2017/0194556 A1* | 7/2017 | Brown | H01L 27/222 |
| 2018/0040817 A1* | 2/2018 | Chuang | H01L 27/222 |
| 2018/0130943 A1* | 5/2018 | Naik | H01F 10/3254 |
| 2018/0233663 A1* | 8/2018 | Shum | H01L 43/12 |

OTHER PUBLICATIONS

Sung-Min Ahn et al., Crossover between in-plane and perpendicular anisotropy in Ta/Co x Fe100-x /MgO films as a function of Co composition, Journal of Applied Physics, 2013, pp. 17C112 (1-3), vol. 113, Issue 17, AIP Publishing.

C.Bilzer et al., Study of the dynamic magnetic properties of soft CoFeB films, Journal of Applied Physics, 2006, pp. 053903(1-4), vol. 100, Issue 5, American Institute of Physics.

Luc Thomas et al., Solving the Paradox of the Inconsistent Size Dependence of Thermal Stability at Device and Chip-level in Perpendicular STT-MRAM, Electron Devices Meeting (IEDM), 2015, pp. 26.4.1-26.4.4., IEEE.

\* cited by examiner

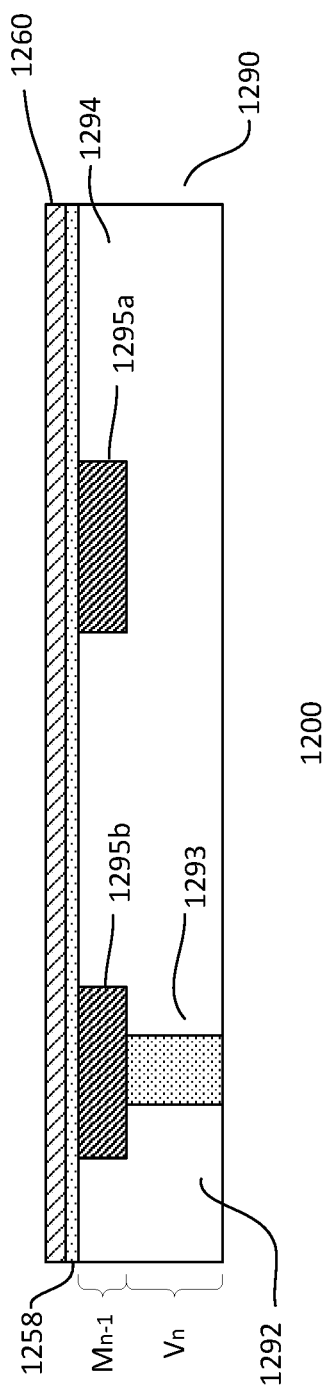

HIGH ENERGY BARRIER PERPENDICULAR MAGNETIC TUNNEL JUNCTION ELEMENT WITH REDUCED TEMPERATURE SENSITIVITY

CROSS-REFERENCE TO RELATED APPLICATIONS

This application claims the priority of U.S. Provisional Application No. 62/416,719, entitled "Reflow Compatible Crystalline Free Layers in Magnetic Tunnel Junction" filed on Nov. 3, 2016, which is herein incorporated by reference in its entirety.

BACKGROUND

A magnetic tunnel junction (MTJ) is used in a Magnetic Random Access Memory (MRAM) to store information. A MTJ typically has at least two magnetic layers separated by a tunneling barrier layer. The tunneling barrier layer allows electrons to tunnel from one magnetic layer to the other. Data storage is achieved by the directional change, from parallel to antiparallel, or vice versa, of magnetic layers in a MTJ.

Information is stored in one of the magnetic layer, which is called a free layer or a storage layer. An important aspect of the MRAMs is to stably store information. However, conventional packaging processing used to form MRAM chips requires temperatures of about 260° C. Exposure of the MTJs to such high temperatures degrades the stability of information stored. This creates information storage stability problems as the embedded MRAM applications often have the MTJs pre-programmed with information prior to packaging.

From the foregoing discussion, it is desirable to provide a reliable MRAM device which can stably store information at backend packaging processing temperatures. This eliminates the high temperature concern for the MTJ element.

SUMMARY

Embodiments of the present disclosure generally relate to a method of forming a device. The method includes providing a substrate which includes circuit component formed on a substrate surface, performing back-end-of-line (BEOL) processing to form a BEOL dielectric layer. The BEOL dielectric layer includes a plurality of interlevel dielectric (ILD) levels. The method further includes forming a perpendicular magnetic tunnel junction (pMTJ) stack between adjacent ILD levels of the BEOL dielectric layer. The pMTJ stack is disposed between top and bottom electrodes. Forming the pMTJ stack includes sequentially forming various layers of the pMTJ on the bottom electrode. The various layers include a magnetic fixed layer, a first tunnelling barrier layer, and a magnetic free layer. The first tunnelling barrier layer is disposed between the magnetic fixed layer and the magnetic free layer. The magnetic free layer includes an as-deposited crystalline magnetic free layer which reduces temperature sensitivity of the pMTJ stack.

In another embodiment, a device is disclosed. The device includes a substrate which includes circuit component formed on a substrate surface, a BEOL dielectric layer disposed on the substrate covering the circuit components, and a perpendicular magnetic tunnel junction (pMTJ) stack disposed between adjacent ILD levels of the BEOL dielectric layer. The BEOL dielectric layer comprises a plurality of interlevel dielectric (ILD) levels. The pMTJ stack is disposed between top and bottom electrodes. The pMTJ includes a magnetic fixed layer, a first tunnelling barrier layer, and a magnetic free layer. The first tunnelling barrier layer is disposed between the magnetic fixed layer and the magnetic free layer. The magnetic free layer includes an as-deposited crystalline magnetic free layer which reduces temperature sensitivity of the pMTJ stack.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 9a-9e show cross-sectional views of an embodiment of a process for forming a memory cell.

DETAILED DESCRIPTION

Embodiments of the present disclosure generally relate to semiconductor devices and methods for forming a semiconductor device. For example, the semiconductor device is a memory device. For example, the memory device may be magnetoresistive random access memory (MRAM) device. Other types of memory devices may also be useful. A magnetoresistive memory cell includes a magnetic tunneling junction (MTJ) storage unit. For example, the MTJ storage unit is a perpendicular MTJ (pMTJ) stack. The pMTJ stack of the present disclosure includes a free layer that is less temperature sensitive and is reflow compatible, e.g., enough stability of magnetization at 260° C. during the reflow process. In one embodiment, an interface between a tunneling barrier layer and a free layer is engineered by inserting molecules with a small radius to enhance perpendicular magnetic anisotropy (PMA) of the free layer. Such memory devices, for example, may be incorporated into standalone memory devices including, but not limited to, USB or other types of portable storage units, or integrated circuits (ICs), such as microcontrollers or system on chips (SoCs). The devices or ICs may be incorporated into or used with, for example, consumer electronic products or other types of products.

Figure 1A:
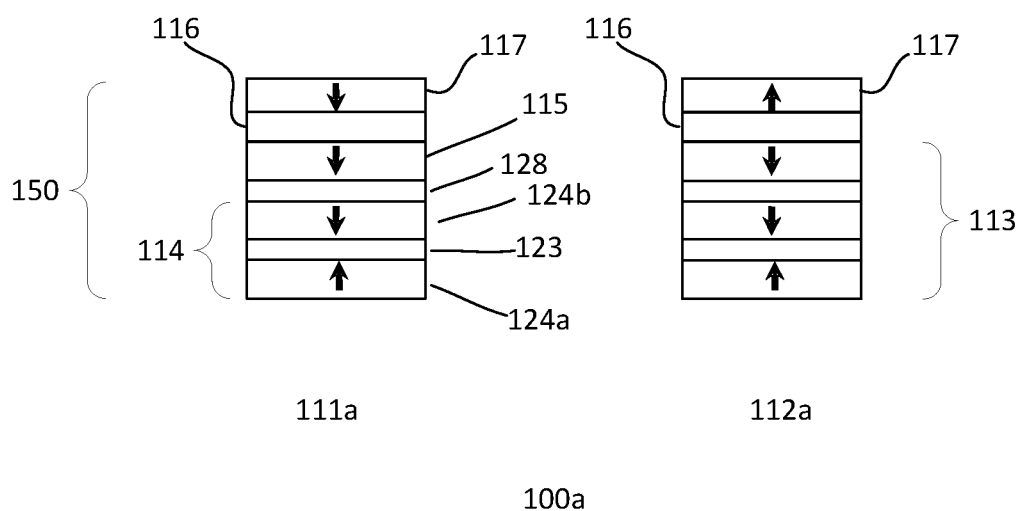
FIGS. 1a-1b show simplified diagrams of parallel state and anti-parallel state of bottom pinned and top pinned perpendicular MTJ (pMTJ) modules of a magnetic memory cell.

FIG. 1a shows simplified diagrams of parallel state and anti-parallel state of a bottom pinned perpendicular MTJ module 100a of a magnetic memory cell. The embodiment shows a simplified cross-sectional view of a bottom pinned perpendicular MTJ (pMTJ) unit or module 100a of a magnetic memory cell. The MTJ module includes a pMTJ element or stack 150 disposed between a bottom electrode and a top electrode. The bottom electrode is proximate to the substrate on which the memory cell is formed while the top electrode is distal from the substrate.

The MTJ element includes a magnetically fixed (pinned) layer 113, a tunneling barrier layer 116 and a magnetically free layer 117. In one embodiment, the magnetically fixed layer 113 is disposed below the magnetically free layer 117, forming a bottom pinned pMTJ stack. The magnetic orientation or magnetization of the fixed layer 113 is fixed in a first perpendicular direction. The term perpendicular direction, for example, refers to the direction of the magnetic field which is perpendicular to the surface of a substrate or perpendicular to the plane of the layers of the MTJ module.

The magnetic fixed layer includes a synthetic antiferromagnetic (SAF) layer 114. The SAF layer includes first and second magnetic layers 124a and 124b separated by an exchange coupling layer 123. The first and second magnetic layers of the SAF layer have opposite directions of magnetization. For example, as shown, the first magnetic layer 124a has a first magnetization direction which is in the upward direction while the second magnetic layer 124b has a second magnetization direction which is in the opposite or downward direction. A reference layer 115 is disposed over the SAF layer. The reference layer and the SAF layer are separated by a spacer layer 128. The reference layer has a magnetization direction which is in the same direction as the second magnetic layer of the SAF layer. For example, the reference layer has a second magnetization direction. The SAF layer, for example, pins the magnetization of the reference layer in the second magnetization direction.

As shown, the first magnetization direction is in an upward perpendicular direction away from the bottom electrode. Providing the first magnetization direction which is in a downward perpendicular direction towards the bottom electrode may also be useful. As for the magnetic orientation or magnetization of the free layer 117, it may be programmed to be in a first or same direction as the reference layer 115 or in a second or opposite direction as the reference layer 115.

For example, as shown by structure 111a, the magnetic orientation or magnetization of the free layer 117 is programmed to be in the first or parallel magnetization direction as the reference layer 115. The corresponding MTJ electrical resistance between the free layer 117 and the reference layer 115 is denoted as RP. Structure 112a illustrates that the magnetic orientation of the free layer 117 is programmed to be in the second or anti-parallel direction to the reference layer 115. The corresponding MTJ electrical resistance between the free layer 117 and the reference layer 115 is denoted as RAP. The resistance RAP is higher than the resistance RP, corresponding to first and second states of the memory cell.

Figure 1B:
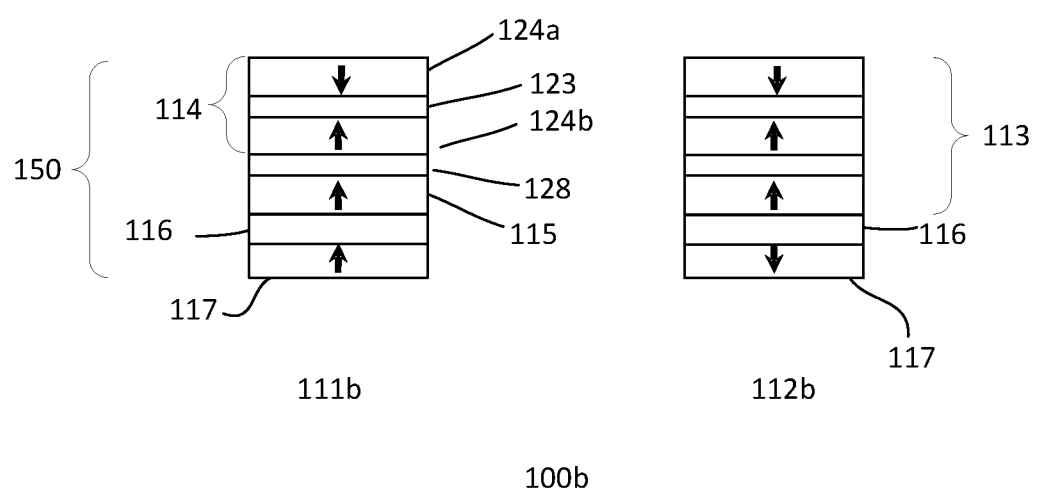

FIG. 1b shows simplified diagrams of parallel state and anti-parallel state of a top pinned pMTJ module of a magnetic memory cell. The embodiment shows a simplified cross-sectional view of a top pinned pMTJ unit or module 100b of a magnetic memory cell. The MTJ module includes a pMTJ element or stack 150 disposed between a bottom electrode and a top electrode. The bottom electrode is proximate to the substrate on which the memory cell is formed while the top electrode is distal from the substrate. The top pinned pMTJ unit is similar to the bottom pinned pMTJ unit of FIG. 1a. Common elements may not be described or described in detail. As shown, the free layer 117 is disposed below the fixed layer 113. In structure 111b, the free layer 117 is programmed to have a same or parallel magnetization direction as the reference layer 115 while the free layer 117 in structure 112b is programmed to have an opposite or anti-parallel magnetization direction as the reference layer 115.

Figure 2A:
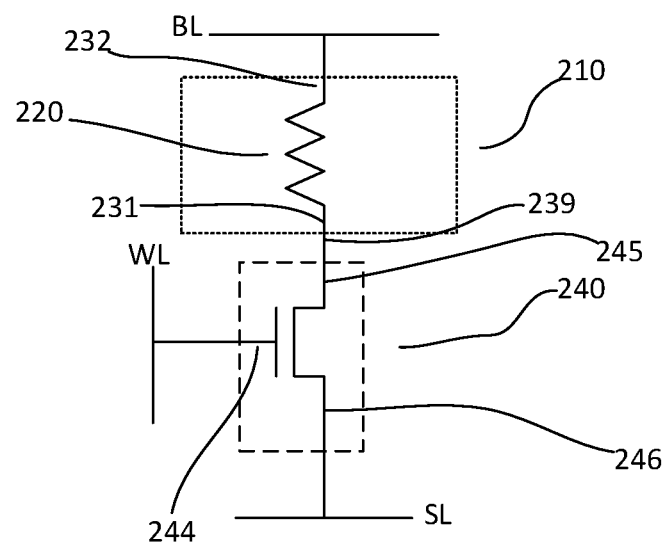
FIG. 2a shows a schematic diagram of an exemplary embodiment of a magnetic memory cell.

FIG. 2a shows a schematic diagram of an embodiment of a memory cell 200. The memory cell is a non-volatile memory (NVM) cell. For example, the memory cell may be a magnetoresistive memory cell. In one embodiment, the memory cell is a spin transfer torque-magnetoresistive random access memory (STT-MRAM) cell. Other suitable types of memory cells may also be useful. The memory cell includes a storage unit 210 and a cell selector unit 240. The storage unit 210 is coupled to the cell selector unit 240. For example, the storage unit 210 and the cell selector unit 240 are coupled at a first cell node 239 of the memory cell. The storage unit 210, in one embodiment, is a magnetic storage unit and includes a pMTJ stack 220. The pMTJ stack may be a bottom pinned pMTJ stack or a top pinned pMTJ stack.

The pMTJ stack includes first and second electrodes 231 and 232. The first electrode 231, for example, may be a bottom electrode while the second electrode 232 may be a top electrode. Other configurations of electrodes may also be useful. In one embodiment, the top electrode 232 of the storage unit 210 is electrically connected to a bit line (BL). The bottom electrode 231 of the storage element 210 is connected to the first cell node 239.

The cell selector unit 240 includes a selector for selecting the memory cell. The selector, for example, may be a select transistor. In one embodiment, the select transistor is a metal oxide semiconductor (MOS) transistor. In one embodiment, the selector is a n-type MOS transistor. The select transistor includes first and second source/drain (S/D) terminals 245 and 246 and a gate or control terminal 244. The S/D terminals, for example, are heavily doped regions with first polarity type dopants, defining the first type transistor. For example, in the case of a n-type transistor, the S/D terminals are n-type heavily doped regions. Other types of transistors or selectors may also be useful.

In one embodiment, the first terminal of the cell selector and the first electrode of the storage unit are commonly coupled at the first cell node. For example, the first S/D terminal 245 of the cell selector 240 is coupled to the bottom electrode 231 of the storage unit 210. The second terminal 246 of the cell selector is coupled to a source line (SL). As for the gate terminal 244, it is coupled to a wordline (WL).

Figure 2B:
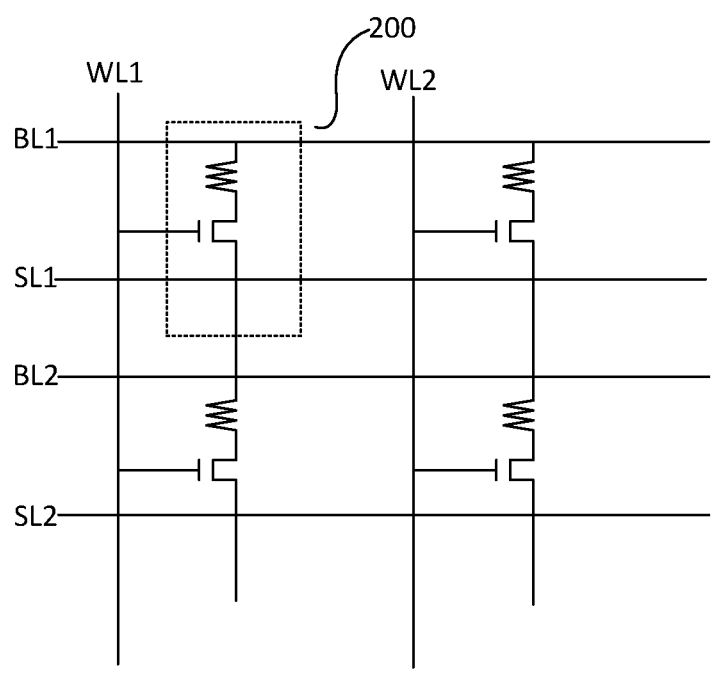
FIG. 2b shows a schematic diagram of an exemplary array of magnetic memory cells.

FIG. 2b shows a schematic diagram of an embodiment of a memory array 250. The array includes a plurality of memory cells 200 interconnected. The memory cells may be similar to the memory cell described in FIG. 2a. For example, the memory cells are MRAM cells, such as STT-MRAM cells. Common elements may not be described or described in detail. Other suitable types of memory cells may also be useful.

As shown, the array includes four memory cells arranged in a 2×2 array. For example, the array is arranged to form two rows and two columns of memory cells. Memory cells of a row are interconnected by a wordline (WL1 or WL2)

while memory cells of a column are interconnected by a bitline (BL1 or BL2). A S/D terminal is coupled to a source line (SL1 or SL2). Other suitable cell configurations may also be useful. Although the array is illustrated as a 2×2 array, it is understood that arrays of other sizes may also be useful.

Figure 3A:
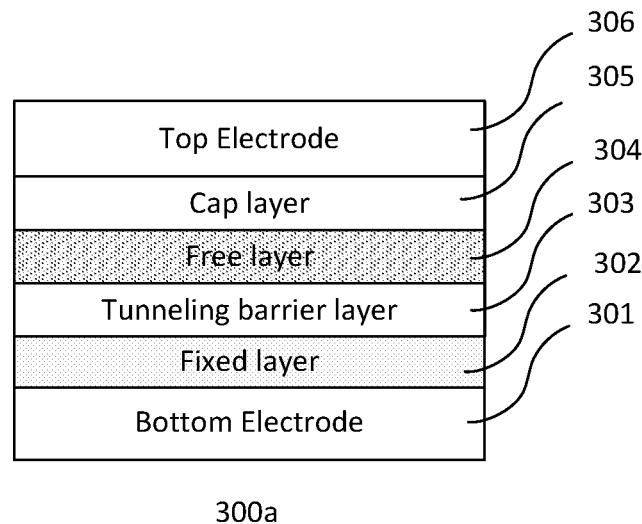
FIGS. 3a-3d show cross-sectional views of embodiments of a pMTJ stack of a magnetic memory cell.

FIG. 3a shows a cross-sectional view of a MTJ stack of a magnetic memory cell. The cross-sectional view may be along a bitline direction (x-axis). The MTJ stack, as shown, is a bottom pinned pMTJ stack with a stack of layers. In one embodiment, the pMTJ stack 300a is a single tunneling barrier bottom pinned pMTJ stack. The pMTJ stack may include a MTJ element disposed between a bottom electrode 301 and a top electrode 306. The electrodes may be tantalum-based (Ta-based), titanium-based (Ti-based) or tungsten-based (W-based) electrodes. For example, the electrodes may be tantalum (Ta), tantalum nitride (TaN), titanium (Ti) or titanium nitride (TiN). In one embodiment, the bottom electrode may be a TaN electrode while the top electrode may be a Ta electrode. Other types or configurations of electrodes may also be useful.

The pMTJ element includes a magnetic fixed layer 302, a tunneling barrier layer 303, a magnetic free layer 304 and a cap layer 305. The layers of the pMTJ element may be sequentially formed on the bottom electrode. The stack layers, including the bottom and top electrodes, may be patterned to form a pMTJ stack of a memory cell. Other configurations of patterning the layers to form the pMTJ stack may also be useful. In one embodiment, the magnetic fixed layer 302 is disposed below the magnetic free layer 304, creating a bottom pinned pMTJ stack. In one embodiment, the magnetic free layer includes at least one as-deposited crystalline magnetic layer. The magnetic orientation or magnetization of the free layer may be programmed to be in the first or same direction as the fixed layer, or in a second or opposite direction as the fixed layer.

The tunneling barrier layer 303 is disposed between the fixed and the free magnetic layers. The tunneling barrier layer may be a metal oxide layer. The oxide layer is a non-magnetic and electrically insulating layer which is used for maintaining spin polarization during electron transit across the barrier. The tunneling barrier layer may be a crystalline magnesium oxide (MgO). Other types of tunneling barrier layers, such as an amorphous aluminum oxide ($Al_2O_3$), may also be used. As for the cap layer, it is disposed over the magnetic free layer. The cap layer may serve to protect the underlying free layer and to promote the perpendicular magnetic anisotropy (PMA) in the free layer. The cap layer may be a Pt, Ru, or Ta cap layer. Other types of cap layer, such as MgO, may also be useful. For example, the cap layer may serve as a second tunneling barrier layer or vice-versa.

The MTJ stack may include additional layers. In some cases, the MTJ stack may include a seed or underlayer (not shown) disposed on the bottom electrode. For example, the seed layer may be disposed between the bottom electrode and fixed layer. The seed layer may serve to provide a proper template for fixed magnetic layer. In one embodiment, the seed layer may include Ni, Cr, Ru, Pt, Fe, Co, W, Ta, Ir, or a combination of thereof. In some cases, the seed layer may include more than one element. For example, the seed layer may include Ru—Cr, Ru—Pt, Ru—Ir, NiFeCr, NiCr, NiW or NiTa. Other types of seed layers may also be used. The seed layer may be formed by physical vapour deposition (PVD).

Figure 3B:
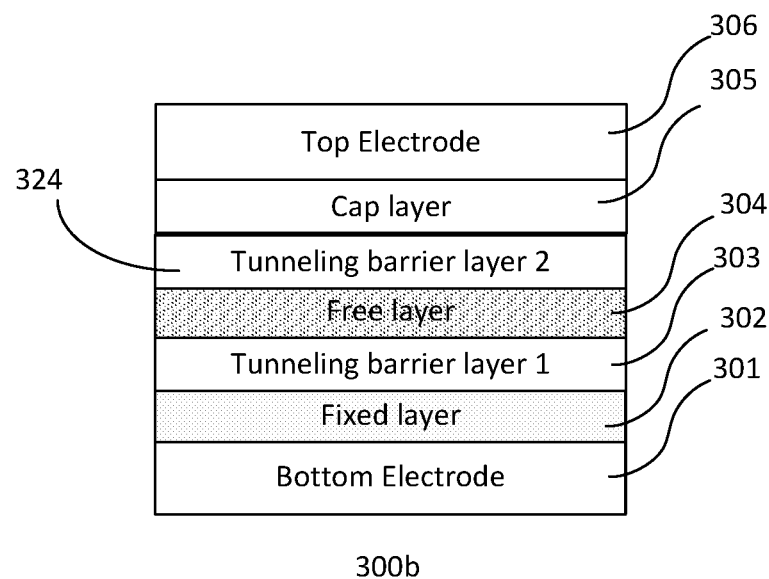

In another embodiment, as shown in FIG. 3b, the pMTJ stack 300b is a dual tunneling barrier bottom pinned pMTJ stack. For example, the pMTJ stack includes first and second tunneling barrier layers 303 and 324. The dual tunneling barrier pMTJ stack is similar to the single tunneling barrier bottom pinned pMTJ stack of FIG. 3a. Common elements may not be described or described in detail. As shown, the second tunneling barrier layer 324 is disposed between the free layer 304 and the cap layer 305. The second tunneling barrier layer 324 may be of the same or different materials as the first tunneling barrier layer 303. Other configurations of tunneling barrier layers may also be useful.

Figure 3C:
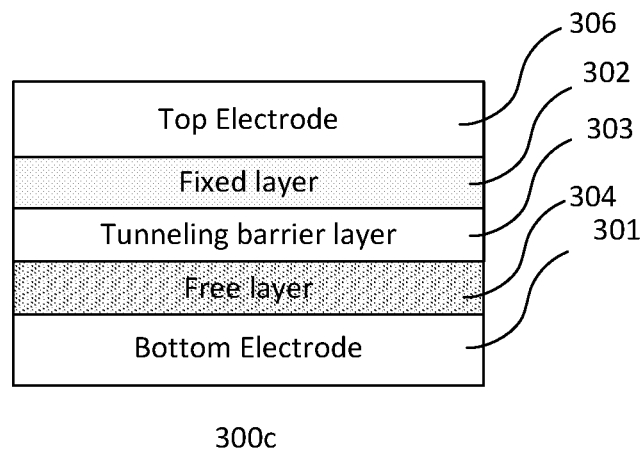

FIG. 3c shows a cross-sectional view of a MTJ stack of a magnetic memory cell. The cross-sectional view may be along a bitline direction (x-axis). The MTJ stack 300c, as shown, is a single tunneling barrier top pinned pMTJ stack. The pMTJ stack is similar to the pMTJ stacks described in FIGS. 3a-3b except that it is a top pinned pMTJ stack instead of a bottom pinned pMTJ stack. Common elements may not be described or described in detail.

The pMTJ stack may include a pMTJ element disposed between a bottom electrode 301 and a top electrode 306. The pMTJ element includes a magnetic free layer 304, a tunneling barrier layer 303 and a magnetic fixed layer 302. The layers may be sequentially formed on the bottom electrode. The stack may include additional layers. For example, a buffer layer (not shown in FIG. 3c) may be disposed between the fixed layer and top electrode. The buffer layer may be a Rh, Ir, Ti, Cr, Ru, W, Mo, Hf layer, or a combination of thereof and serves to improve crystal orientation of the fixed layer.

Figure 3D:
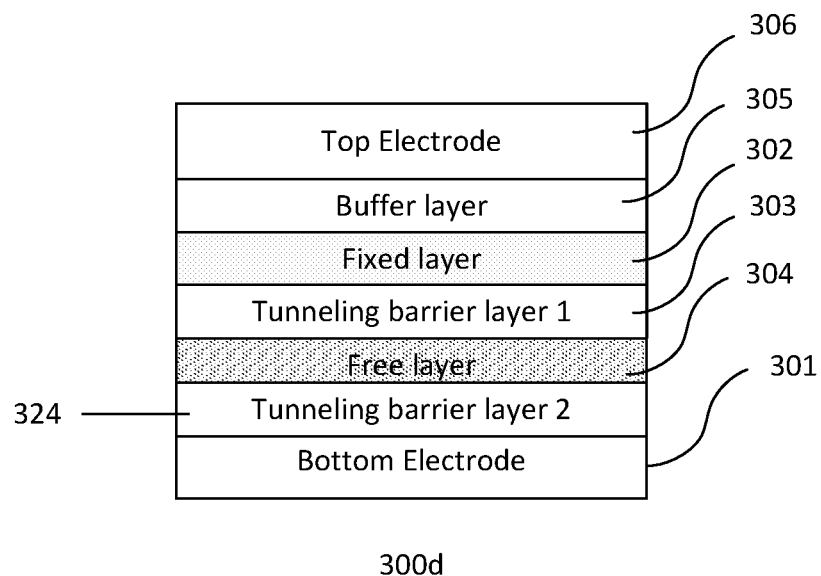

FIG. 3d shows a cross-sectional view of a MTJ stack of a magnetic memory cell. The MTJ stack 300d, as shown, is a dual tunneling barrier top pinned pMTJ stack. The pMTJ stack is similar to the pMTJ stacks described in FIGS. 3a-3c. Common elements may not be described or described in detail. The pMTJ stack includes a pMTJ element disposed between a bottom electrode 301 and a top electrode 306. The pMTJ element includes a second tunneling barrier layer 324, a magnetic free layer 304, a first tunneling barrier layer 303, a magnetic fixed layer 302 and a buffer layer 305. The layers may be sequentially formed on the bottom electrode.

Figure 4A:
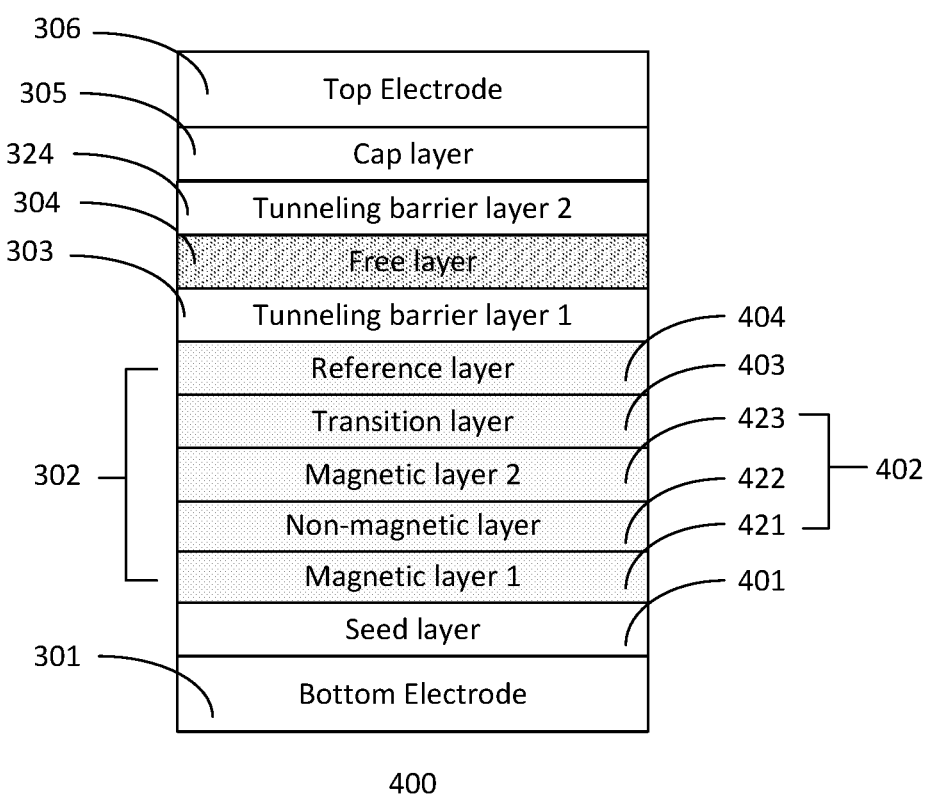
FIGS. 4a-4b show cross-sectional views of embodiments of a pMTJ stack of a magnetic memory cell.

FIG. 4a shows a more detailed cross-sectional view of an embodiment of a dual tunneling barrier bottom pinned pMTJ stack of a magnetic memory cell. The pMTJ stack is similar to those described in FIGS. 3a-3b. Common components may not be described or described in detail. As shown, the pMTJ stack 400 includes a pMTJ element disposed between a bottom electrode 301 and a top electrode 306. The pMTJ element includes a seed layer 401, a fixed magnetic layer 302, a first tunneling barrier layer 303, a free magnetic layer 304, a second tunneling barrier layer 324 and a cap layer 305.

As for the seed layer 401, it may be disposed on the bottom electrode 301. The seed layer may include a planar top surface for ensuring good adhesion to the subsequent layers. The seed layer may include nickel (Ni), chromium (Cr), ruthenium (Ru), iron (Fe), cobalt (Co), iridium (Ir), tungsten (W), tantalum (Ta), platinum (Pt) or a combination thereof. For example, the seed layer may include more than one material or layer, such as Ru, Ru—Cr, Ru—Pt, Ru—Ir, NiFeCr, NiCr, NiW and NiTa. Other types or configurations of materials suitable for used as the seed layer in the pMTJ stack may also be useful.

The magnetic fixed layer 302 may be disposed on the seed layer 401. The fixed layer, as shown, includes a hard magnetic (HM) layer 402, a transition layer 403 and a reference layer 404. The HM layer 402 may be a synthetic antiferromagnetic (SAF) layer. The SAF layer may include a first magnetic layer 421 and a second magnetic layer 423. The magnetic layers may be an alloy magnetic layer or a multilayer. The first and the second magnetic layers may be formed with the same or different materials. For example, the first and second magnetic layers may be CoPt, CoNi or Co-alloy layers. Other magnetic materials may also be useful. A non-magnetic layer 422 may be disposed between the first and second magnetic layers, to facilitate the exchange coupling field between the two magnetic layers. For example, the non-magnetic layer may be a Ru, Ir, Cr, Rh layer, or a combination of thereof. Other non-magnetic materials may also be useful.

The transition layer 403 is disposed on the magnetic layer 402. The transition layer includes a non-magnetic layer. The transition layer may include Ti, V, Cr, Zr, Nb, Mo, Hf, Ta, W, Al or a combination thereof. The transition layer may serve to govern the growth of the subsequently formed layers. Other non-magnetic materials suitable for used as the transition layer in the pMTJ stack may also be useful.

The reference or polarizer layer 404 is disposed on the transition layer 403. The reference layer may include one or more magnetic layers. In one embodiment, the reference layer includes one or more CoFe or CoFeB based layers. In one embodiment, the reference layer is an amorphous layer. For example, the reference layer may be an as-deposited amorphous CoFeB layer. Other types of polarizer layers may also be useful. The as-deposited amorphous layer enhances the tunnel magnetoresistance (TMR) effect of the MTJ stack.

The first tunneling barrier layer 303 is disposed between the reference layer 404 and the free layer 304. The second tunneling barrier layer 324 may be disposed between the free layer 304 and the cap layer 305. The tunneling barrier layers may be, for example, MgO layers. Other types or configurations of tunneling barrier layers may also be useful. For example, the pMTJ stack may be a single barrier pMTJ stack with only a first tunneling barrier disposed between the reference layer and free layer, such as that shown in FIG. 3*a*.

The cap layer 305 is disposed on the second tunneling barrier layer 324. The cap layer may serve to protect the underlying free layer and to promote the PMA in the free layer. The cap layer may be a Pt, Ru, or Ta cap layer. Other types of cap layer, such as MgO, may also be useful. In one embodiment, for example, the second tunneling barrier layer may serve as the cap layer. As for the top electrode layer 306, it is disposed on the cap layer.

In one embodiment, the magnetic free layer 304 includes at least one as-deposited crystalline magnetic layer. For example, the magnetic layer is deposited as a crystalline layer. The magnetic layer may be formed by sputtering or atomic layer deposition (ALD). The crystalline magnetic layer may be an as-deposited crystalline cobalt-iron (CoFe) based magnetic free layer. In one embodiment, the as-deposited crystalline CoFe based magnetic free layer is an as-deposited crystalline CoFe or a CoFe—X layer, where X is selected from the group which includes titanium (Ti), vanadium (V), chromium (Cr), zirconium (Zr), niobium (Nb), molybdenum (Mo), hafnium (Hf), tantalum (Ta), tungsten (W), boron (B), aluminum (Al), germanium (Ge), silicon (Si), and tin (Sn) or a combination thereof. For example, X may be one or more elements from the group. For example, in the case where X includes B, the atomic weight percentage of B may be $\leq 20\%$. In other embodiments, B may be $\leq 15\%$. In yet other embodiments, B may be $\leq 10\%$. In addition, the ratio of Co:Fe may be from 0:100-100:0.

The thickness of the magnetic free layer may be about 1-5 nm. Other thicknesses may also be useful. The magnetic free layer may be formed by, for example, sputtering or ALD. In one embodiment, the magnetic free layer is formed using crystalline target. For example, the magnetic free layer may be formed using a crystalline CoFe or CoFeB target.

In some embodiments, the magnetic free layer may be a composite magnetic free layer having multiple magnetic layers. For example, the composite magnetic free layer may include n plurality of as-deposited crystalline magnetic free layers, where $n \geq 2$. A composite magnetic free layer may, in some cases, include an as-deposited amorphous magnetic layer. For example, the composite magnetic free layer may include an as-deposited crystalline magnetic layer and an as-deposited amorphous magnetic layer. Alternatively, a composite magnetic free layer may include an as-deposited amorphous magnetic layer between two as-deposited crystalline magnetic layers. The overall thickness of the composite magnetic free layer may be about 1-5 nm. The more layers that a composite magnetic free layer has, the thinner that each layer of the composite magnetic free layer may be. Furthermore, it is understood that the layers of the composite magnetic free layer need not be the same thickness. For example, an as-deposited amorphous magnetic layer may be relatively thinner than an as-deposited crystalline magnetic layer. Different crystalline magnetic layers may have different thicknesses as well as different amorphous magnetic layers may have different thicknesses.

As for the as-deposited amorphous magnetic free layer, it is a cobalt-iron-boron (CoFeB) based magnetic free layer. The CoFeB based magnetic free layer may be a CoFe—Y magnetic free layer, where Y is selected from the group which includes B, Ti, V, Cr, Zr, Nb, Mo, Hf, Ta, W, Al or a combination thereof. For example, Y may be one or more elements from the group. For example, in the case where Y includes B, the atomic weight percentage of B may be $>20\%$. In another embodiment, the atomic weight percentage of B is $\geq 35\%$. In addition, in the case where Y is B, the ratio of Co:Fe may be from 0:100-100:0. In other words, the magnetic layer may include CoFeB, CoB and FeB, with the atomic weight percent of $B>20\%$ or $\geq 35\%$. The amorphous magnetic free layer may be formed by, for example, sputtering or ALD. In one embodiment, the magnetic free layer is formed using an amorphous target. For example, the magnetic free layer may be formed using an amorphous CoFe or CoFeB target.

In one embodiment, the MTJ stack may be annealed to improve the crystalline structure of the as-deposited crystalline magnetic layer. For example, the MTJ stack may be annealed at a temperature of about 300-400° C. for a period of about 10 minutes to 2 hours.

As discussed, the free layer is used to store information. By providing a crystalline magnetic layer in the MTJ, the magnetic exchange stiffness (Aex) is increased compared to an as-deposited amorphous magnetic free layer. This suppresses or reduces temperature sensitivity of energy barrier (Eb) of the free layer, improving information storage stability of the MTJ. In addition, reducing temperature sensitivity of Eb reduces power consumption. In conventional MRAMs, Eb needs to be increased at room temperature to compensate for temperature sensitivity. Increasing Eb at room temperature results in a larger chip size, higher power consumption, as well as reducing endurance. However, the present MTJ stack does not need Eb to be increased at room temperature as with the conventional MTJ stacks. This avoids the need to increase chip size as in conventional MTJ stacks, resulting in lower power consumption and improved endurance.

Figure 4B:
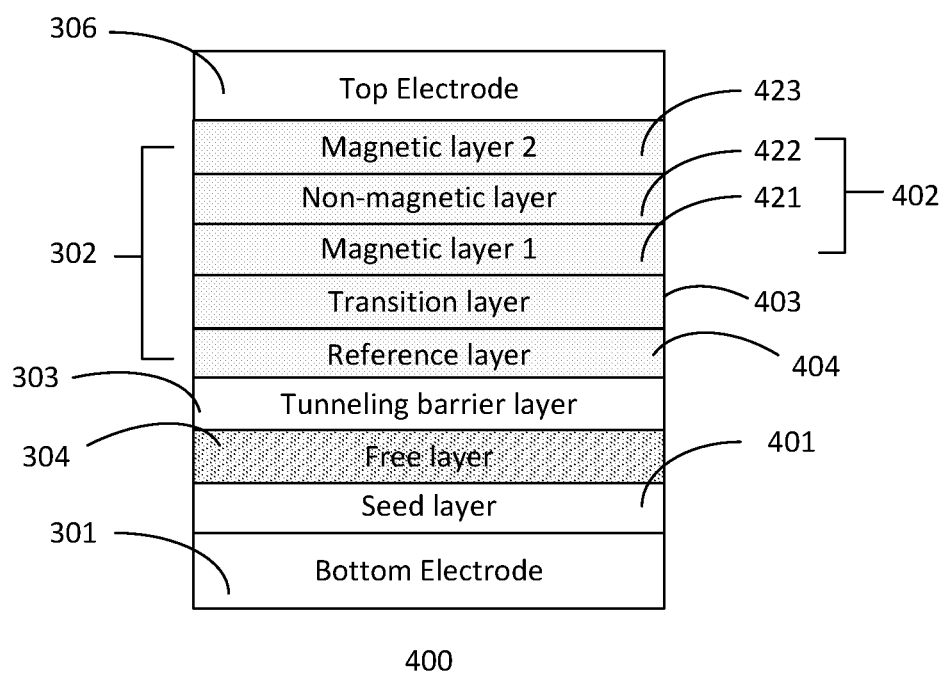

FIG. 4b shows a more detailed cross-sectional view of an embodiment of a single tunneling barrier top pinned pMTJ stack of a magnetic memory cell. The pMTJ stack is similar to those described in FIGS. 3a-3d and 4a. Common components may not be described or described in detail.

The pMTJ stack is disposed between bottom and top electrodes 301 and 306. The pMTJ stack may include a seed layer 401, a magnetic free layer 304, a tunneling barrier layer 303 and a fixed magnetic layer 302. The layers may be sequentially formed on the bottom electrode and patterned to form the pMTJ.

The seed layer 401 may be disposed on the bottom electrode 301. The magnetic free layer 304 may be disposed on the seed layer 401. The magnetic free layer, for example, includes at least one as-deposited crystalline magnetic layer. Providing a composite magnetic free layer which includes a plurality of as-deposited crystalline magnetic layers or a combination of as-deposited crystalline and as-deposited amorphous magnetic layers, as described in FIG. 4a, may also be useful.

The tunneling barrier layer 303 is disposed on the free layer 304. The tunneling barrier layer may be, for example, a MgO layer. Other types or configurations of tunneling barrier layers may also be useful. For example, the pMTJ stack may be a dual tunneling barrier pMTJ stack with first tunneling and second barrier layers, such as that shown in FIG. 3d.

The fixed layer may be disposed on the tunneling barrier layer. As shown, the fixed layer includes a hard magnetic (HM) layer 402, a transition layer 403 and a reference layer 404. The HM layer 402 may be a synthetic antiferromagnetic (SAF) layer. The SAF layer may include a first magnetic layer 421 and a second magnetic layer 423. The top electrode 306 is disposed over the fixed layer. For example, the top electrode is disposed on the second magnetic layer 423 of the SAF layer.

As described in FIGS. 4a-4b, the pMTJ stacks include a dual tunneling barrier bottom pinned pMTJ stack and a single tunneling barrier top pinned pMTJ stack. It is understood that the pMTJ stacks may be modified to include a single tunneling barrier bottom pinned pMTJ stack, as described in FIG. 3a and a dual tunneling barrier top pinned pMTJ stack, as described in FIG. 3d.

As also described, a pMTJ stack includes a single as-deposited crystalline magnetic free layer. In other embodiments, the free layer may be a composite free layer having a plurality of magnetic free layers. FIGS. 5a-5d show various embodiments of composite free layers.

Figure 5A:
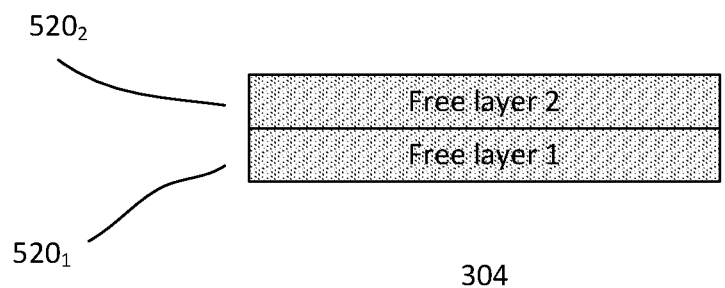
FIGS. 5a-5d show cross-sectional views of embodiments of a composite magnetic free layer.

Referring to FIG. 5a, an embodiment of a composite free layer 304 is shown. The composite free layer includes a first magnetic free layer $520_1$ and a second magnetic free layer $5202$. For example, the composite free layer is a magnetic bilayer. The second magnetic free layer is disposed over the first magnetic free layer. As shown, the composite free layer includes a single magnetic bilayer. The composite bilayer may be disposed between a first tunneling barrier layer and a cap layer in the case of a single tunneling barrier bottom pinned pMTJ stack or between first and second tunneling barrier layers in the case of a dual tunneling barrier bottom pinned pMTJ stack. Providing the composite free layer for a single tunneling barrier or dual tunneling barrier top pinned pMTJ stack may also be useful.

In one embodiment, at least one of the magnetic free layers of the bilayer is a crystalline magnetic free layer. In one embodiment, the first magnetic free layer is an as-deposited crystalline magnetic free layer while the second free layer is an as-deposited non-crystalline or amorphous magnetic free layer. Preferably, at least the first or bottom magnetic free layer is an as-deposited crystalline magnetic free layer. Alternatively, the first or bottom magnetic free layer is an as-deposited magnetic free layer. For example, the first magnetic free layer is an as-deposited crystalline magnetic layer while the second magnetic free layer is an as-deposited amorphous magnetic layer or the first magnetic free layer is an as-deposited amorphous magnetic layer and the second magnetic free layer is an as-deposited crystalline magnetic layer. The total thickness of the composite magnetic free layer may be about 1-5 nm. Other thicknesses may also be useful. The as-deposited amorphous magnetic layer preferably is relatively thinner than the as-deposited crystalline magnetic layer. Other configurations of the magnetic layers may also be useful.

An as-deposited crystalline magnetic free layer, as already discussed, may be a CoFe based magnetic free layer. For example, the crystalline CoFe based magnetic free layer may include CoFe or CoFe—X, where X is selected from the group which includes Ti, V, Cr, Zr, Nb, Mo, Hf, Ta, W, B, Al, Ge, Si, Sn or a combination thereof. For example, X may be one or more elements from the group. In the case where X includes B, the atomic weight percentage of B is at most 20%. In other embodiments, B may be ≤15%. In yet other embodiments, B may be ≤10%. In addition, the ratio of Co:Fe may be from 0:100-100:0. In other words, the crystalline magnetic layer may include CoFeB, CoB and FeB, with B≤20%. In other embodiments, B is ≤15% or ≤10%. The as-deposited crystalline magnetic free layer may be formed by sputtering or ALD. In one embodiment, the magnetic free layer is formed using crystalline target. For example, the magnetic free layer may be formed using a crystalline CoFe or CoFeB target.

As for an as-deposited amorphous magnetic free layer, it is a cobalt-iron-boron (CoFeB) based magnetic free layer. The CoFeB based magnetic free layer may be a CoFe—Y magnetic free layer, where Y is selected from the group which includes B, Ti, V, Cr, Zr, Nb, Mo, Hf, Ta, W, Al or a combination thereof. For example, Y may be one or more elements from the group. In the case where Y includes B, the atomic weight percentage of B is >20%. In another embodiment, the atomic weight percentage of B is ≥35%. In addition, the ratio of Co:Fe may be from 0:100-100:0. In other words, the crystalline magnetic layer may include CoFeB, CoB and FeB, with the atomic weight percent of B is >20%. In another embodiment, the atomic weight percentage of B is ≥35%. The as-deposited amorphous magnetic free layer may be formed by, for example, sputtering or ALD. In one embodiment, the magnetic free layer is formed using an amorphous target. For example, the magnetic free layer may be formed using an amorphous CoFe or CoFeB target.

In one embodiment, the MTJ stack may be annealed to improve the crystalline structure of the as-deposited crystalline magnetic layer. For example, the MTJ stack may be annealed at a temperature of about 300-400° C. for a period of about 10 minutes to 2 hours. Other configurations of the stack and annealing process may also be useful. For example, the annealing process may include multiple annealing processes, each performed after forming each as-deposited crystalline magnetic layer or a single anneal performed after the stack is completed.

In another embodiment, the first and second magnetic free layers of the bilayer are as-deposited crystalline magnetic free layers. In the case where both free layers are crystalline magnetic layers, they are different crystalline magnetic free layers. The as-deposited crystalline magnetic bilayer may be, for example, a CoFe/CoFeMo bilayer. The crystalline magnetic layers may be formed as previously described.

Figure 5B:
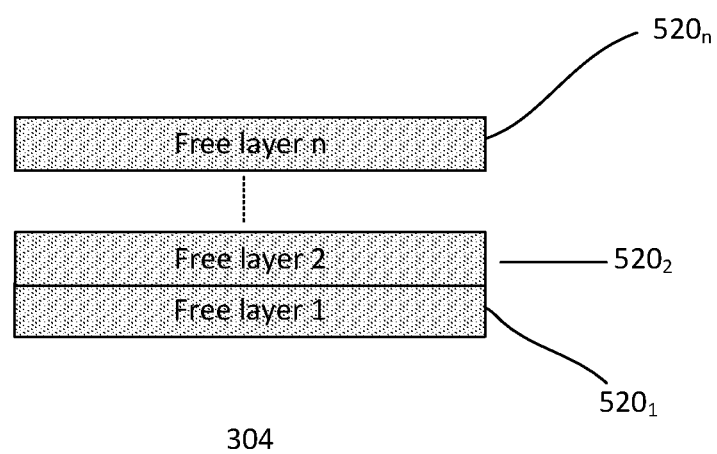

FIG. 5b shows another embodiment of a composite free layer 304. As shown, the composite free layer may include a n multiple of magnetic free layers $520_{1-n}$, where n>1. The number n may be, for example, from 2-10. Other values of n, including 1, may also be useful. In one embodiment, at least one of the n layers is an as-deposited crystalline magnetic free layer. For example, the composite free layer may include as-deposited crystalline magnetic free layers or a combination of as-deposited crystalline and as-deposited amorphous magnetic layers, as already described. The more as-deposited crystalline magnetic layers there are, the more preferable it is. In the case wherein the composite magnetic free layer includes both as-deposited crystalline and as-deposited amorphous magnetic layers, the bottom (or first) magnetic layer preferably is an as-deposited crystalline magnetic free layer. Providing an as-deposited amorphous magnetic layer for the bottom magnetic layer may also be useful. Adjacent as-deposited crystalline magnetic free layers are different and adjacent as-deposited amorphous magnetic free layers are different. The as-deposited crystalline and as-deposited amorphous magnetic free layers may be formed as previously described. The total thickness of the composite magnetic free layer may be about 1-5 nm. Other thicknesses may also be useful. An as-deposited amorphous magnetic layer preferably is relatively thinner than an as-deposited crystalline magnetic layer. Other configurations of the magnetic layers may also be useful.

Figure 5C:
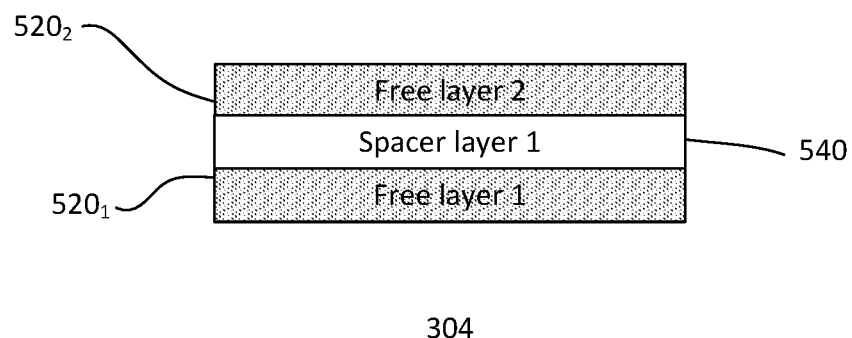

Referring to FIG. 5c, another embodiment of a composite magnetic free layer 304 is shown. The free layer includes first and second magnetic free layers $520_{1-2}$ separated by a spacer layer 540. The spacer layer, in one embodiment, is a non-magnetic metal spacer layer. In one embodiment, the spacer layer may be selected from a group which includes Ti, V, Cr, Zr, Nb, Mo, Hf, Ta, W, B, Al or a combination thereof. The non-magnetic spacer layer may contain other magnetic materials such as Co, Fe, or Ni. For example, the non-magnetic spacer layer contains less than 10% Co, Fe, or Ni. Other types and percentages of suitable magnetic metal materials may also be useful. The thickness of the spacer layer may be 0.05-1 nm. Other thicknesses may also be useful.

In one embodiment, at least one of the first and second magnetic free layers is a crystalline magnetic free layer. For example, the first magnetic free layer disposed below the spacer layer may be an as-deposited crystalline magnetic free layer while the second magnetic free layer disposed above the spacer layer may be an as-deposited amorphous magnetic free layer. Alternatively, for example, the first magnetic free layer disposed below the spacer layer may be an as-deposited amorphous magnetic free layer while the second magnetic free layer disposed above the spacer layer may be an as-deposited crystalline magnetic free layer. In some cases, both the first and second magnetic free layers may be both as-deposited crystalline magnetic free layers. The as-deposited crystalline and as-deposited amorphous magnetic free layers may be the same or similar as the as-deposited crystalline and the as-deposited amorphous magnetic free layers as already described. The total thickness of the composite magnetic free layer, including the spacer layer, may be about 1-5 nm. Other thicknesses may also be useful. The as-deposited amorphous magnetic layer preferably is relatively thinner than the as-deposited crystalline magnetic layer. The pMTJ stack may be annealed to improve the crystalline structure of an as-deposited crystalline magnetic free layer.

In some embodiments, at least one of the magnetic free layers of the composite free layer may be a composite free layer, such as those described in FIG. 5a-5b. For example, the first magnetic free layer below the spacer layer may be a composite magnetic free layer and the second magnetic free layer disposed above the spacer may be a single magnetic free layer. Alternatively, the first magnetic free layer below the spacer layer may be a single magnetic free layer and the second magnetic free layer disposed above the spacer may be a composite magnetic free layer. Providing both first and second magnetic fee layers which are composite magnetic free layers may also be useful.

As an example, a first magnetic free layer disposed below the spacer layer (SP) of the composite free layer may include a first magnetic free layer (FL1) and a second first magnetic free layer FL1' while the second magnetic free layer (FL2) disposed above SP may be a single magnetic free layer. This produces a composite free layer as follows: FL1/FL1'/SP/FL2. In another example, both the first and second magnetic free layers of the composite magnetic free layer disposed below and above SP may each be a composite magnetic free layer. For example, the first magnetic free layer may include a FL1 and FL1' while the second magnetic free layer may include FL2 and FL2'. This produces a composite free layer as follows: FL1/FL1'/SP/FL2/FL2'. In yet another embodiment, the first and second magnetic free layer of the composite magnetic free layer may include 3 (n=3) magnetic free layers, as described in FIG. 5b. For example, the first magnetic free layer disposed below SP is a composite magnetic free layer with 3 magnetic free layers FL1, FL1' and FL1"; the second magnetic free layer disposed above SP is a composite magnetic free layer with FL2, FL2' and FL2". This produces a composite free layer as follows: FL1/FL1'/FL1"/SP/FL2/FL2'/FL2". Any other configurations of composite magnetic free layers may also be useful. Furthermore, the various first and/or second composite magnetic may include as-deposited crystalline magnetic layers or a combination of as-deposited crystalline and as-deposited amorphous magnetic layers, as described in FIGS. 5a-5b.

Figure 5D:
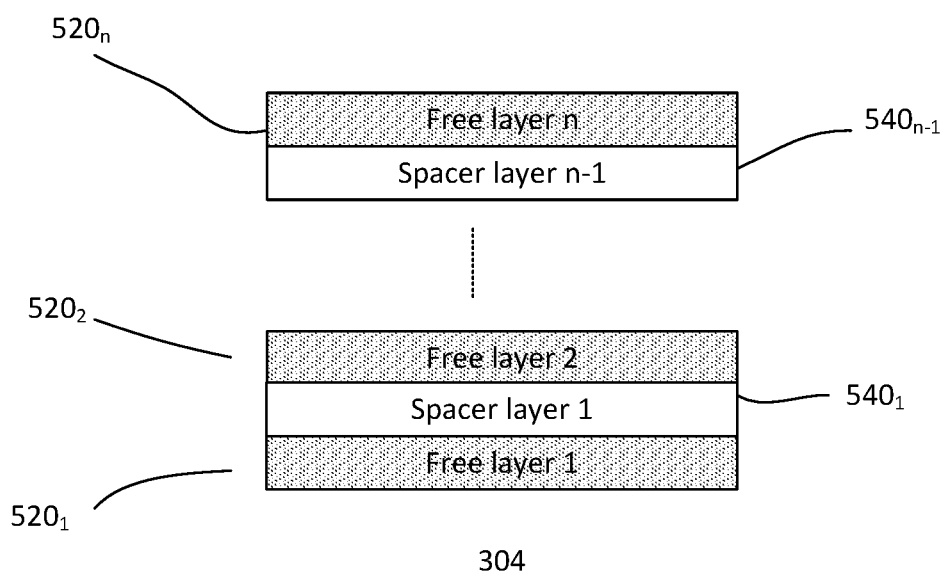

In FIG. 5d, another embodiment of a composite free layer 304 is shown. The composite free layer is similar to that of FIG. 5c. Common elements may not be described or described in detail. The composite free layer includes n magnetic free layers $520_{1-n}$, each separated by spacer layers $540_{1-n-1}$. For example, a spacer layer is disposed between two magnetic free layers. The spacer layer, in one embodiment, is a non-magnetic metal spacer layer, such as Ti, V, Cr, Zr, Nb, Mo, Hf, Ta, W, B, Al or a combination thereof. The non-magnetic spacer layer may contain other magnetic materials such as Co, Fe, or Ni. For example, the non-magnetic spacer layer contains less than 10% Co, Fe, or Ni. The thickness of a spacer layer may be 0.05-1 nm. Other thicknesses may also be useful.

As shown, the bottom and top magnetic free layers $520_1$ and $520_n$ are the bottom and top layers of the composite free layer. The number n may be, for example, from 2-10. Other values of n may also be useful.

In one embodiment, at least one of the n layers is a crystalline magnetic free layer. Providing one or more of the n layers which is an as-deposited amorphous magnetic free layer may also be useful. In one embodiment, at least the bottom (n=1) magnetic free layer is an as-deposited crystalline magnetic free layer. In other cases, the bottom magnetic free layer may be an as-deposited amorphous magnetic free layer. The more as-deposited crystalline magnetic free layers there are, the more preferable it is. In some embodiments, all of the n magnetic free layers are crystalline magnetic free layers.

A magnetic free layer of the n magnetic free layer may be a single magnetic free layer or a composite magnetic free layer as described in FIGS. 5a-5d. For example, the n magnetic free layers may be all single magnetic free layers, a combination of single and composite magnetic free layers or all composite magnetic free layers. The various single magnetic free layers and composite free layers may include all as-deposited crystalline free layers or a combination of as-deposited crystalline and as-deposited amorphous free layers. The total thickness of the composite magnetic free layer, including the spacer layer, may be about 1-5 nm. Other thicknesses may also be useful. The as-deposited amorphous magnetic layer preferably is relatively thinner than the as-deposited crystalline magnetic layer. The pMTJ stack may be annealed to improve the crystalline structure of an as-deposited crystalline magnetic free layer.

Figure 6A:
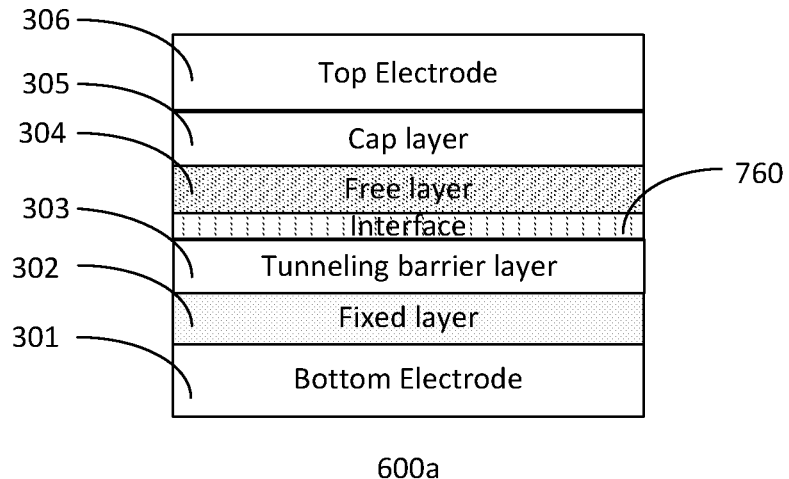
FIGS. 6a-6b show cross-sectional views of embodiments of a pMTJ stack of a magnetic memory cell.

FIG. 6a shows a simplified cross-sectional view of an embodiment of a pMTJ stack of a MRAM cell with enhanced perpendicular magnetic anisotropy (PMA), which increases Eb. As shown, the pMTJ stack 600a is a single tunneling barrier bottom pinned pMTJ stack. The pMTJ stack is similar to the pMTJ stacks shown in FIGS. 3a-3d and FIGS. 4a-4b. Common elements may not be described or described in detail. The pMTJ stack may be disposed between a bottom electrode 301 and a top electrode 306. The electrodes may be tantalum-based (Ta-based), titanium-based (Ti-based) or tungsten-based (W-based) electrodes. For example, the electrodes may be tantalum (Ta), tantalum nitride (TaN), titanium (Ti) or titanium nitride (TiN). In one embodiment, the bottom electrode may be a TaN electrode while the top electrode may be a Ta electrode. Other types or configurations of electrodes may also be useful.

The pMTJ stack includes a magnetic fixed layer 302, a tunneling barrier layer 303 and a magnetic free layer 304. The layers may be sequentially formed on the bottom electrode. In one embodiment, the magnetic fixed layer 302 is disposed below the magnetic free layer 304. The magnetic fixed layer 302 may be similar to that described in FIGS. 4a-4b. As for the magnetic free layer, its magnetic orientation or magnetization may be programmed to be in the first or same direction as the fixed layer, or in a second or opposite direction as the fixed layer.

A tunneling barrier layer 303 is disposed between the fixed and the free layer. The tunneling barrier layer may be a metal oxide layer. The oxide layer is a non-magnetic and electrically insulating layer which is used for maintaining spin polarization during electron transit across the barrier. The oxide layer may be a crystalline magnesium oxide (MgO). Other metal oxides suitable for used as the tunneling barrier layer in the pMTJ stack may also be useful.

A cap layer 305 is disposed over the magnetic free layer. The cap layer may serve to protect the underlying free layer and to promote the perpendicular magnetic anisotropy (PMA) in the free layer. The cap layer may be a Pt, Ru, or Ta cap layer. Other types of cap layer, such as MgO, may also be useful.

In one embodiment, an interface layer 760 is disposed between the tunneling barrier layer 303 and the magnetic free layer 304. In one embodiment, the interface layer is a lattice modulating layer. In one embodiment, the interface layer is a lattice shrinking layer. For example, the interface layer shrinks the lattice of tunneling barrier layer, improving the lattice matching with the free layer. A compressive stress is applied in the in-plane direction (in-plane compressive stress). This results in tensile stress received by the tunneling barrier layer and/or free layer which is perpendicular to the in-plane direction (perpendicular tensile stress). The perpendicular tensile stress on the free layer increases the PMA of the free layer. In addition, the temperature sensitivity of Eb of the free layer is also reduced.

In one embodiment, the interface layer has an atomic radius less than that of the tunneling barrier layer. For example, in the case of a MgO tunneling barrier, the interface layer has an atomic radius less than MgO. In one embodiment, the interface layer includes a tunneling oxide layer doped with lattice shrinking molecules. In the case of a MgO tunneling barrier layer, the interface layer may include MgO doped with Al. For example, the interface layer is $MgAl_2O_4$. Other types of lattice shrinking layers having a smaller atomic radius than the tunneling barrier may also be useful. By shrinking the lattice of the tunneling barrier layer, a lattice matching between the tunneling oxide layer and free layer is improved. This causes compressive stress on the free layer which is perpendicular to the in-plane direction to improve PMA of the free layer.

Figure 6B:
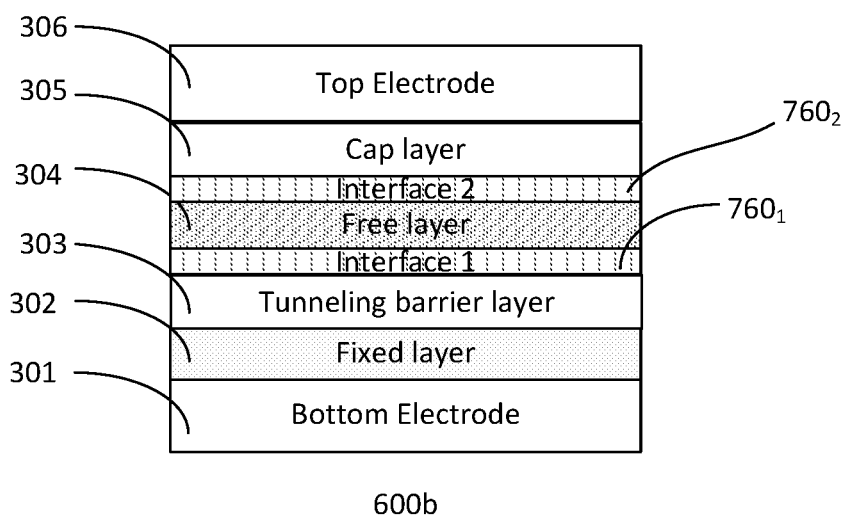

In another embodiment, as shown in FIG. 6b, the pMTJ stack 600b includes first and second interface layers 7601 and 7602. For example, in the case that the cap layer is a metal oxide layer, such as a MgO layer, first and second interface layers may be provided at the interface between the free layer 304 and the tunneling barrier layer 303, and the interface between the free layer 304 and the cap layer 305. This enhances the tensile stress on the free layer in the direction perpendicular to the in-plane direction, further improving the PMA of the free layer.

Figure 7:
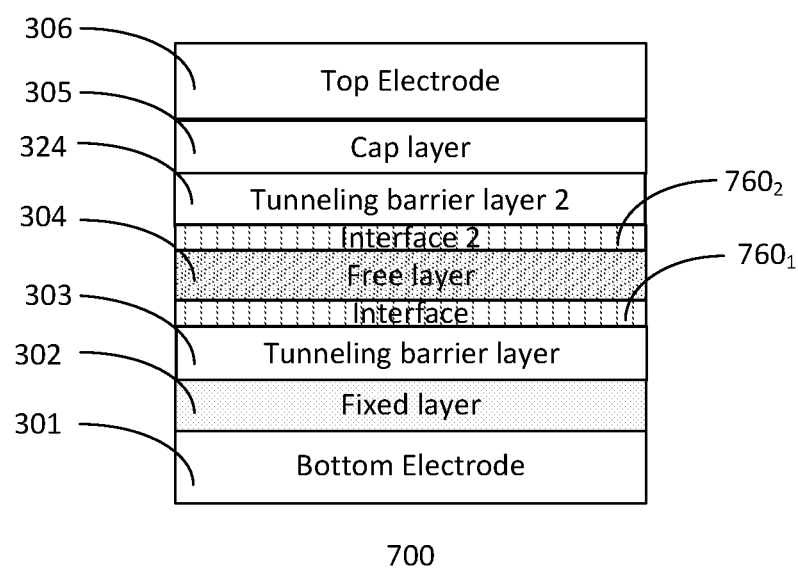
FIG. 7 shows a cross-sectional view of another embodiment of a pMTJ stack of a magnetic memory cell.

FIG. 7 shows a cross-sectional view of another embodiment of a MTJ stack 700 of a MRAM cell with enhanced perpendicular magnetic anisotropy (PMA), which increases Eb. The MTJ stack is similar to the MTJs shown in FIGS. 3a-d, 4a-b and 6a-b. Common elements may not be described or described in detail.

In one embodiment, the MTJ stack is a dual barrier bottom pinned pMTJ stack. The pMTJ stack may be disposed between a bottom electrode 301 and a top electrode 306. The electrodes may be Ta-based, Ti-based or W-based electrodes. For example, the electrodes may be tantalum (Ta), tantalum nitride (TaN), titanium (Ti) or titanium nitride (TiN). In one embodiment, the bottom electrode may be a TaN electrode while the top electrode may be a Ta electrode. Other types or configurations of electrodes may also be useful.

The pMTJ stack includes a magnetic fixed layer 302, a first tunneling barrier layer 303, a magnetic free layer 304, a second tunneling barrier layer 324 and a cap layer 305. The layers may be sequentially formed on the bottom electrode. In one embodiment, the magnetic fixed layer 302 is disposed below the magnetic free layer 304. The magnetic fixed layer 302 may be similar to that described in FIG. 4a-b. As for the magnetic free layer, its magnetic orientation or magnetization may be programmed to be in the first or same direction as the fixed layer, or in a second or opposite direction as the fixed layer.

In one embodiment, a first interface layer 7601 is disposed between the interface of the first tunneling barrier layer 303 and the magnetic free layer 304 and a second interface layer 7602 is disposed between the interface of the magnetic free layer 304 and the second tunneling barrier layer 324. The interface layers may be similar to the interface layer described in FIG. 6a-b. For example, the interface layers apply compressive stress in the in-plane direction (in-plane compressive stress). This results in tensile stress received by the tunneling barrier layer and/or free layers which are perpendicular to the in-plane direction (perpendicular tensile stress). This improves PMA for the free layer. In addition, the temperature sensitivity of Eb of the free layer is also reduced.

As described, one or more interface layers are provided for a single or dual tunneling barrier bottom pinned pMTJ stack. It is understood that one or more interface layers may also be provided for a single or dual tunneling barrier top pinned pMTJ stack. Furthermore, as described, the free layer of FIGS. 6a-b and 7 is a single free layer, such as that described in FIGS. 3a-d and 4a-b. In other embodiments, the free layer may be a composite free layer, such as those described in FIGS. 5a-d.

Figure 8:
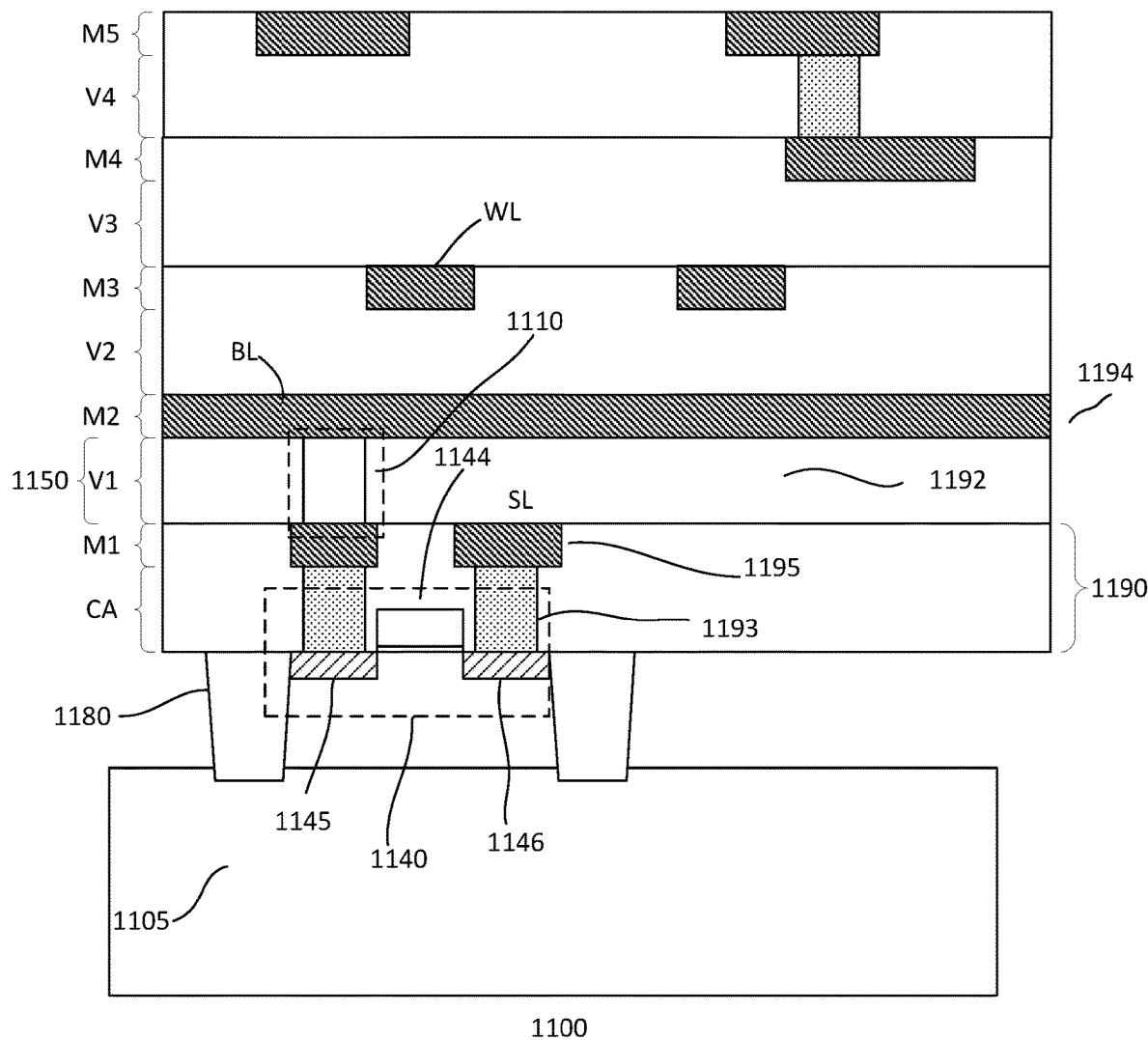
FIG. 8 shows a cross-sectional view of an embodiment of a device.

FIG. 8 shows a cross-sectional view of an exemplary embodiment of a memory cell 1100 of a device. The cross-sectional view, for example, is along a second or bitline direction of the device. The device, as shown, includes a memory cell 1100. The memory cell, for example, may be a NVM memory cell. The memory cell, in one embodiment, is a magnetoresistive NVM cell, such as a STT-MRAM cell. The memory cell, for example, includes a pMTJ stack which is the same or similar to those described in FIGS. 3a-3d, 4a-b, 6a-b and 7. Common elements may not be described or described in detail.

The memory cell is disposed on a substrate 1105. For example, the memory cell is disposed in a cell region of the substrate 1105. The cell region may be part of an array region. For example, the array region may include a plurality of cell regions. The substrate 1105 may include other types of device regions (not shown), such as high voltage (HV) as well as logic regions, including low voltage (LV) and intermediate voltage (IV) device regions. Other types of regions may also be provided.

The substrate 1105, for example, is a semiconductor substrate, such as a silicon substrate. For example, the substrate 1105 may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate 1105 may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front-end-of-line (FEOL) processing is performed on the substrate 1105. The FEOL process, for example, forms n-type and p-type devices or transistors on the substrate 1105. The p-type and n-type device form a complementary MOS (CMOS) device. The FEOL processing, for example, includes forming isolation regions, various device and isolation wells, transistor gates and transistor source/drain (S/D) regions and contact or diffusion regions serving as a substrate or well taps. Forming other components with the FEOL process may also be useful.

Isolation regions 1180, for example, serve to isolate different device regions. The isolation regions may be shallow trench isolation (STI) region. To form STI regions, trenches are formed and filled with isolation material. A planarization process, such as chemical mechanical polishing (CMP) is performed to remove excess dielectric materials, forming isolation regions. Other types of isolation regions may also be useful. The isolation regions are provided to isolate device regions from other regions.

Device wells (not shown), for example, serve as bodies of p-type and n-type transistors. Device wells are doped wells. Second type doped device wells serve as bodies of first type transistors. For example, p-type device wells serve as bodies of n-type transistors and n-type device wells serve as bodies of p-type transistors. Isolation wells may be used to isolate device wells from the substrate. The isolation wells are deeper than the device wells. For example, isolation wells encompass the device wells. The isolation wells are first type doped wells. For example, n-type isolation wells are used to isolate p-type device wells. Separate implants may be employed to form different doped device wells and isolation wells using, for example, implant masks, such as photoresist masks. The wells, for example, are formed after forming isolation regions.

Gates of transistors are formed on the substrate. For example, layers of the gate, such as gate dielectric and gate electrode are formed on the substrate and patterned to form the gates 1144. The gate dielectric may be a silicon oxide layer while the gate electrode layer may be polysilicon. The gate electrode may be doped, for example, to reduce sheet resistance. Other types of gate dielectric and gate electrode layers may also be useful. The gate dielectric layer may be formed by thermal oxidation and the gate electrode layer may be formed by chemical vapor deposition (CVD). Separate processes may be performed for forming gate dielectrics of the different voltage transistors. This is due to, for example, different gate dielectric thicknesses associated with the different voltage transistors. For example, high voltage (HV) transistor will have a thicker gate dielectric than a low voltage (LV) transistor.

The gate layers are patterned by, for example, mask and etch techniques. For example, a patterned photoresist mask may be provided over the gate layers. For example, a photoresist layer is formed over the gate layers and lithographically exposed by using a reticle. The photoresist mask layer is developed, forming a patterned photoresist mask with the desired pattern of the reticle. To improve lithographic resolution, an anti-reflective coating (ARC) layer may be provided between the gate electrode layer and the photoresist mask layer. An anisotropic etch, such as a reactive ion etch (RIE) is used to pattern the gate layers to form the gates using the patterned photoresist mask.

Doped contact regions, such as source/drain (S/D) regions and well or substrate taps are formed in exposed active regions of the substrate 1105 after forming the gates. The contact regions are heavily doped regions. Depending on the type of transistor and well tap, the contact regions may be heavily doped n-type or p-type regions. For n-type transistors, S/D regions are heavily doped n-type regions and for p-type transistors, S/D regions are heavily doped p-type regions. For well taps, they are the same dopant type as the well.

A S/D region may include lightly doped diffusion (LDD) and halo regions. A LDD region is a lightly doped region with first polarity type dopants while the halo region is a lightly doped region with second polarity type dopants. For example, the halo region includes p-type dopants for a p-type transistor while the LDD region includes n-type dopants for n-type transistors. The halo and LDD regions extend under the gate. A halo region extends farther below the gate than a LDD region. Other configurations of LDD, halo and S/D regions may also be useful.

Dielectric spacers (not shown) may be provided on the gate sidewalls of the transistors. The spacers may be used to facilitate the formation of halo, LDD and S/D regions. For example, spacers are formed after halo and LDD regions are formed. Spacers may be formed by, for example, forming a spacer layer on the substrate and anisotropically etching it to remove horizontal portions, leaving the spacers on the sidewalls of the gates. After forming the spacers, an implant is performed to form the S/D regions. Separate implants may be employed to form different doped regions using, for example, implant masks, such as photoresist mask. Well taps of the same dopant type as S/D regions are formed at the same time.

As shown, the FEOL processing forms a cell region isolated by an isolation region 1180, such as a STI region. The cell region is for a memory cell. Isolation regions may be provided to isolate columns of memory cells. Other configurations of isolation regions may also be useful. The cell region may include a cell device well (not shown). The cell device well, for example, serves as a body well for a transistor of the memory cell. The device well may be doped with second polarity type dopants for first polarity type transistors. The device well may be lightly or intermediately doped with second polarity type dopants. In some cases, a cell device isolation well (not shown) may be provided, encompassing the cell device well. The isolation well may have a dopant type which has an opposite polarity to that of the cell device well. For example, the isolation well may include first polarity type dopants. The isolation well serves to isolate the cell device well from the substrate. Well biases may be provided to bias the wells.

The cell device well may be a common well for the cell regions in the array region. For example, the cell device well may be an array well. The cell device isolation well may serve as the array isolation well. Other configurations of device and isolation wells may also be useful. Other device regions of the device may also include device and/or device isolation wells.

The memory cell includes a cell selector unit 1140 and a storage unit 1110. The FEOL forms the cell selector unit 1140 in the cell region. The cell selector unit 1140 includes a selector for selecting the memory cell. The selector, for example, may be a select transistor. In one embodiment, the select transistor is a metal oxide semiconductor (MOS) transistor. The transistor, as shown, includes first and second source/drain (S/D) regions 1145 and 1146 formed in the substrate 1105 and a gate 1144 disposed on the substrate between the S/D regions. The first S/D region 1145 may be referred to as a drain region and the second S/D region 1146 may be referred to as a source region. The S/D regions, for example, are heavily doped regions with first polarity type dopants, defining the type of transistor. For example, in the case of a n-type transistor, the S/D regions are n-type heavily doped regions. Other types of transistors or selectors may also be useful.

As for the gate 1144, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a first or wordline direction. The gate conductor forms a common gate for a row of memory cells.

As discussed, a S/D region may include LDD and halo regions (not shown). Dielectric spacers (not shown) may be provided on the gate sidewalls of the transistors to facilitate forming halo, LDD and transistor S/D regions of the transistor. It is understood that not all transistors include LDD and/or halo regions.

After forming the cell selector unit 1140 and other transistors, back-end-of-line (BEOL) processing is performed. The BEOL process includes forming interconnects in inter-level dielectric (ILD) layers 1190. The interconnects connect the various components of the integrated circuit (IC) to perform the desired functions. An ILD layer includes a metal level 1194 and a contact level 1192. Generally, the metal level 1194 includes conductors or metal lines 1195 while the contact level 1192 includes contacts 1193. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels. For example, x number of ILD levels may be provided. As illustrated, the device includes 5 ILD levels (x=5). Other numbers of ILD levels may also be useful. The numbers of ILD levels may depend on, for example, design requirement or the logic process involved. A metal level of an ILD level may be referred to as $M_i$, where i is from 1 to x and is the $i^{th}$ ILD level of x ILD levels. A contact level of an ILD level may be referred to as where i is the $i^{th}$ ILD level of x ILD levels.

The BEOL process, for example, commences by forming a dielectric layer over the transistors and other components are formed in the FEOL process. The dielectric layer may be silicon oxide. For example, the dielectric layer may be silicon oxide formed by chemical vapor deposition (CVD). The dielectric layer serves as a pre-metal dielectric layer or first contact layer of the BEOL process. The dielectric layer may be referred to as CA level of the BEOL process. Contacts are formed in the CA level dielectric layer. The contacts may be formed by single damascene processes. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as CMP, is performed to remove excess conductive materials, leaving contact plugs in the CA level.

After forming contacts 1193 in the CA level, the BEOL process continues to form a dielectric layer over the substrate 1105, covering the CA level dielectric layer. The dielectric layer, for example, serves as a first metal level M1 of the first ILD layer. The upper dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving a planar surface with M1 dielectric. The first metal level M1 and CA may be referred as a lower ILD level.

The process continues to form additional ILD layers (not shown). For example, the process continues to form upper ILD layers or levels. The upper ILD levels may include ILD level 2 to ILD level x. For example, in the case where x=5 (5 levels), the upper levels include ILD levels from 2 to 5, which include via levels V1 to V4 and metal levels M2 to M5. The number of ILD layers may depend on, for example, design requirement or the logic process involved. The upper ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive materials are removed by, for example, CMP, forming conductors and contacts in an upper ILD layer.

A dielectric liner (not shown) may be disposed between ILD levels and on the substrate 1105. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M5) may have different design rules, such as critical dimension (CD), than the lower ILD levels. For example, Mx may have a larger CD than metal levels M1 to Mx−1 below. For example, the uppermost metal level may have a CD which is 2× or 6× the CD of the metal levels below. Other configurations of the ILD levels may also be useful.

As shown, S/D contacts 1193 are disposed in the CA level. The S/D contacts are coupled to the first and second S/D regions of the select transistor. Other S/D contacts coupled to other S/D regions of transistors may also be provided. The CA level may include a gate contact (not shown) coupled to the gate of the select transistor. The gate contact may be disposed in another cross-section of the device. The contacts may be tungsten contacts while contact pads may be copper pads. Other types of contacts and contact pads may also be useful. Other S/D and gate contacts for other transistors may also be provided.

As described, metal lines are provided in M1. The metal lines are coupled to the S/D contacts 1193. In one embodiment, a SL is coupled to the second S/D region 1146 of the select transistor. As for the first S/D contact 1145, it may be coupled to contact pads or island in M1. The contact pads provide connections to upper ILD levels. The metal lines or pads may be formed of copper or copper alloy. Other types of conductive materials may also be useful.

As for the upper ILD, for example, from 2 to 5, they include contacts in the via level and contact pads/metal lines in the metal level. The contacts and contact pads provide connections from M5 to the first S/D region 1145 of the select transistor.

A pad level (not shown) is disposed over the uppermost ILD level. For example, a pad dielectric level is disposed over Mx. In the case where the device includes 5 metal levels, the pad level is disposed over M5. The pad dielectric layer, for example, may be silicon oxide. Other types of dielectric materials may also be useful. The pad dielectric layer includes pads, such as bond pads or pad interconnects for providing external interconnections to the components. Bond pads may be used for wire bonding while pad interconnects may be provided for contact bumps. The external interconnections may be input/output (I/O), power and ground connections to the device. The pads, for example, may be aluminum pads. Other types of conductive pads may also be useful. A passivation layer, such as silicon oxide, silicon nitride or a combination thereof, may be provided over the pad level. The passivation layer includes openings to expose the pads.

A dielectric liner may be disposed between the uppermost metal level and pad level. The dielectric liner, for example, serves as an etch stop layer during via etch process and it may also serve as a diffusion barrier layer for, for example, copper (Cu) layer. The dielectric liner may be a low k dielectric liner. For example, the dielectric liner may be nBLOK. Other suitable types of dielectric materials for the dielectric liner may also be useful.

The storage unit 1110 of the memory cell is disposed in a storage dielectric layer 1150. The storage dielectric layer 1150 may be a via level of an ILD level. As shown, the storage dielectric layer 1150 is V1. Providing the storage dielectric layer at other via levels may also be useful. In other embodiments, the storage dielectric layer 1150 may be a dedicated storage dielectric layer and is not part of an interconnect level. Other configurations of storage dielectric layer may also be useful. The storage unit 1110 includes a storage element disposed between bottom and top electrodes, forming a pMTJ stack. The pMTJ stack may be pMTJ stacks as previously described, for example, in FIGS. 3*a*-3*d*, 4*a*-4*b*, 5*a*-5*d*, 6*a*-6*b* and 7.

In one embodiment, the bottom electrode of the storage unit is coupled to a drain of the select transistor. For example, the bottom electrode is coupled to a contact pad in the M1 level and a via contact in the CA level. Other configurations of coupling the bottom electrode may also be useful. The top electrode is coupled to a BL. For example, the top electrode is coupled to the BL disposed in M2. The BL is along a bitline direction. As for the source of the select transistor, it is coupled to a SL. For example, a via contact in CA is provided to couple the source region of the select transistor to SL in M1. Providing SL in other levels may also be useful.

As for the gate of cell selector, it is coupled to a WL. The WL, for example, is along a wordline direction. The bitline and wordline directions are perpendicular to each other. As shown, the WL is disposed in M3. The WL may be coupled to the gate by contact pads in M2 and M1 and via contacts in V2 and V1 (not shown). Other configurations of coupling the WL to the gate may also be useful. For example, the WL may be disposed in other metal levels.

Although as described, the various lines and storage element are disposed in specified dielectric levels of the backend dielectric levels, other configurations may also be useful. For example, they may be disposed in other or additional metal levels. For example, the storage element may be provided in an upper via level, such as between M5 and M6 (not shown). Furthermore, the device may include other device regions and components.

FIGS. 9a-9e show simplified cross-sectional views of an embodiment of a process for forming a device 1200. The process includes forming a memory cell. The memory cell, for example, may be a NVM memory cell. The memory cell, in one embodiment, is a magnetoresistive NVM cell, such as a STT-MRAM cell. The memory cell, for example, is similar to that described in FIG. 8. Common elements may not be described or described in detail. The cross-sectional views, for example, are along the bitline direction. Although the cross-sectional views show one memory cell, it is understood that the device includes a plurality of memory cells of, for example, a memory array. In addition, the memory cell can be formed simultaneously with CMOS logic devices on the same substrate.

The simplified cross-sectional views illustrate an upper ILD level 1290. For example, a substrate (not shown) has been processed with FEOL and BEOL processing, as already described, to include the upper ILD level. FEOL processing, for example, forms transistors, including a select transistor of the memory cell. Other types of devices may also be formed on the same substrate. BEOL processing forms interconnects in ILD levels. The upper ILD level includes a via level 1292 and a metal level 1294. For example, the upper ILD level includes V4 and M5. The via level, as shown, includes via contacts 1293 while the metal level includes interconnects. For example, interconnect 1295b is a cell contact pad for coupling to a storage unit and interconnect 1295a is coupled to a pad interconnect. The interconnects, for example, are copper interconnects. Other suitable types of interconnects may also be useful.

Referring to FIG. 9a, a dielectric liner 1258, in one embodiment, is disposed above the metal level. The dielectric liner, for example, serves as an etch stop layer. The dielectric liner may be a low k dielectric liner. For example, the dielectric liner may be nBLOK. Other types of dielectric materials for the dielectric liner may also be useful. The dielectric liner, for example, is formed by CVD. Other suitable techniques for forming the dielectric liner may also be useful.

The process continues to form a dielectric layer. A lower dielectric layer 1260 is formed on the dielectric liner 1258. The lower dielectric layer, in one embodiment, includes oxide materials. The lower dielectric layer may be formed by CVD. Other suitable forming techniques or suitable thicknesses for the lower dielectric layer may also be useful.

Figure 9B:
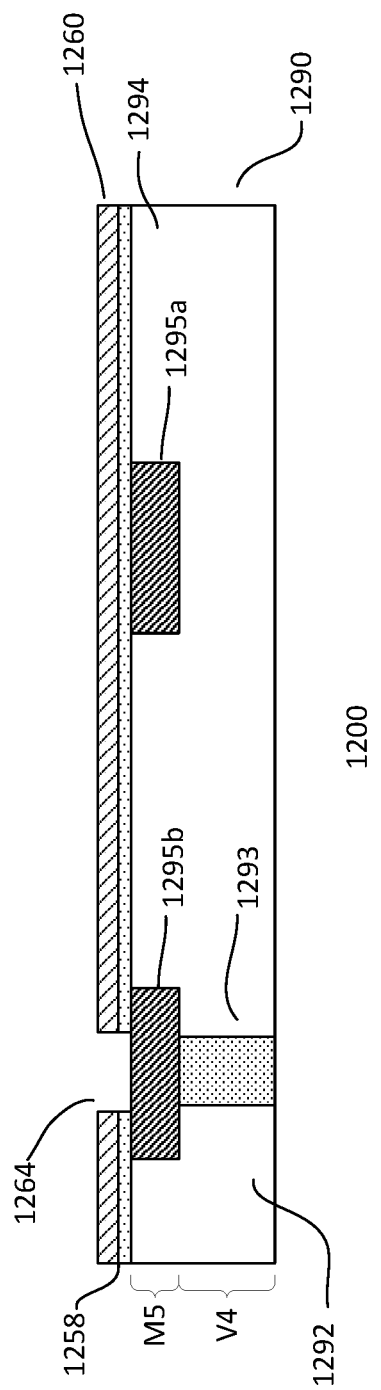

In FIG. 9b, the lower dielectric layer 1260 and the dielectric liner 1258 are patterned to form a storage unit opening 1264. The storage unit opening 1264, for example, is a via opening for accommodating a lower portion of a subsequently formed storage stack. The storage unit opening 1264 exposes a cell contact pad 1295b in the metal level below. The opening may be formed by mask and etch techniques. For example, a patterned photoresist mask may be formed over the lower passivation layer, serving as an etch mask. An etch, such as RIE, may be performed to pattern the lower passivation layer using the patterned resist etch mask. In one embodiment, the etch transfers the pattern of the mask to the lower passivation layer, including the dielectric liner to expose the cell contact pad below.

Figure 9C:
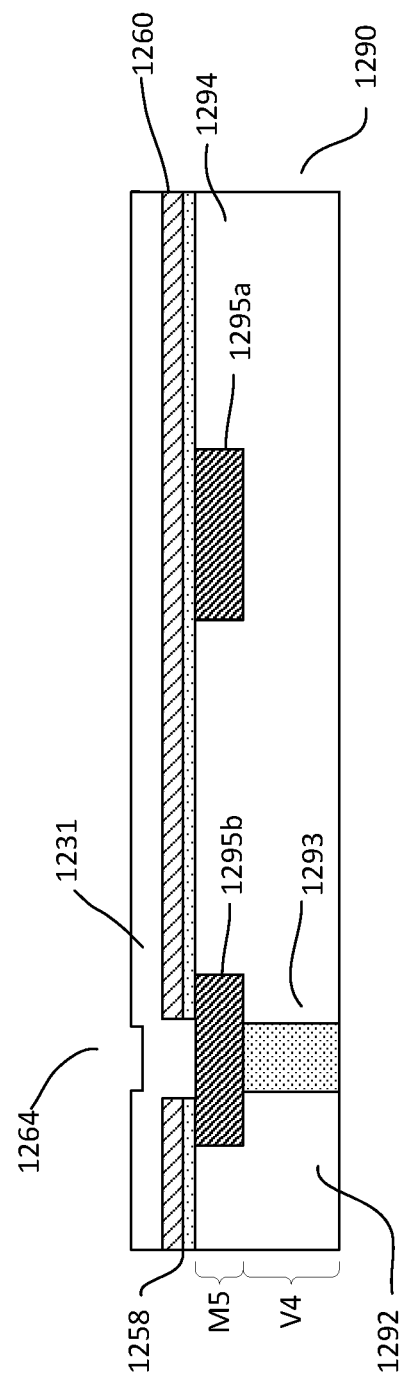
Figure 9D:
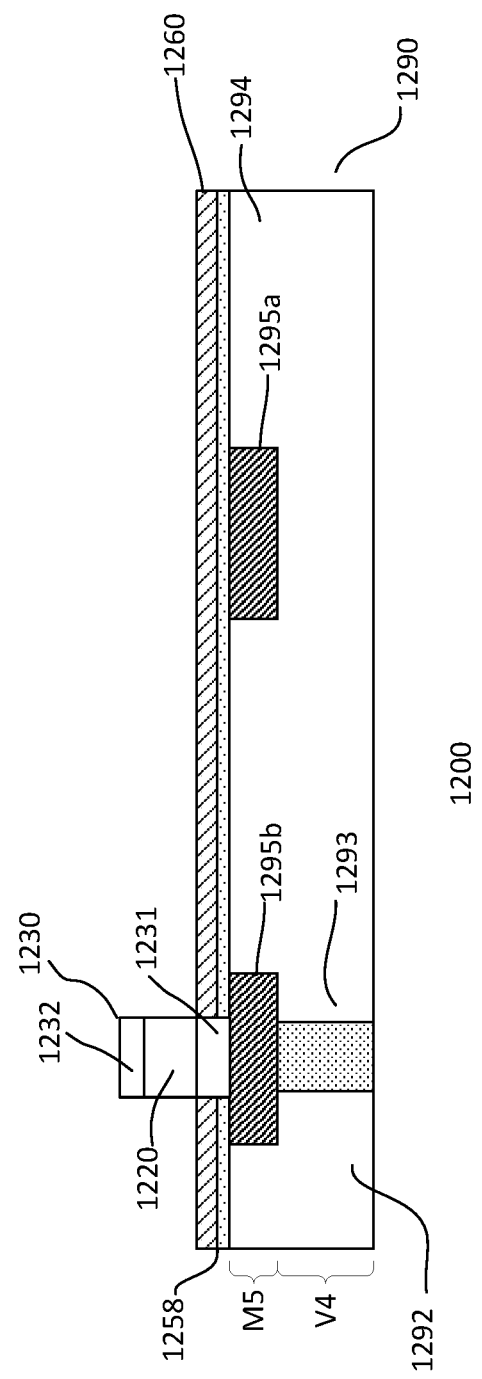

Referring to FIG. 9c, the process continues to form a storage stack. The storage stack may be a magnetic storage stack. The magnetic storage stack is, for example, a pMTJ stack, similar to those describe in FIGS. 3a-d, 4a-b, 6a-b and 7. The pMTJ stack may include various embodiments of the magnetic free layer similar to those described in FIGS. 5a-d. The pMTJ stack forms a storage unit of a MRAM cell, similar to those described in FIG. 8.

The pMTJ stack, for example, includes a storage stack disposed between top and bottom electrodes. The bottom electrode is coupled to a contact pad in the metal level below. For example, the bottom electrode is coupled to a contact pad 1295b in M5. This provides connections of the pMTJ stack to the first S/D region 1145 of the cell select transistor as described in FIG. 2a. As for the top electrode, it is exposed at the top of the intermediate dielectric layer.

The various layers of the pMTJ stack are formed on the substrate. For example, the various layers of the pMTJ stack are sequentially formed over the lower passivation layer and fill the opening. After the opening 1264 is formed, a bottom electrode layer 1231, such as Ta or TaN is deposited over the lower passivation layer and fills the opening. A chemical mechanical polishing (CMP) process is applied to form an embedded bottom electrode in the opening 1264 and remove excess bottom electrode layer in other areas. Other suitable bottom electrode materials and techniques may be employed. The bottom electrode 1231 fills the opening and the surface is flat.

The process continues to form remaining layers of the pMTJ stack, such as the storage stack 1220 and the top electrode 1232, on top of the bottom electrode by physical vapor deposition (PVD) process. The layers of the pMTJ stack are patterned to form the pMTJ stack 1230 as shown. Patterning the layers maybe achieved with a non-conducting mask and etch techniques. After forming the pMTJ stack 1230, the non-conducting mask layer used to pattern the pMTJ stack is removed if dielectric ARC or oxide hard mask layer is used. Other suitable techniques for forming the pMTJ stack may also be useful.

In one embodiment, the substrate is subjected to an alloying process. The alloying process includes annealing the substrate to around 400° C. with duration of about 1-2 hours and with hydrogen ambient. Other annealing parameters may also be useful.

Figure 9E:
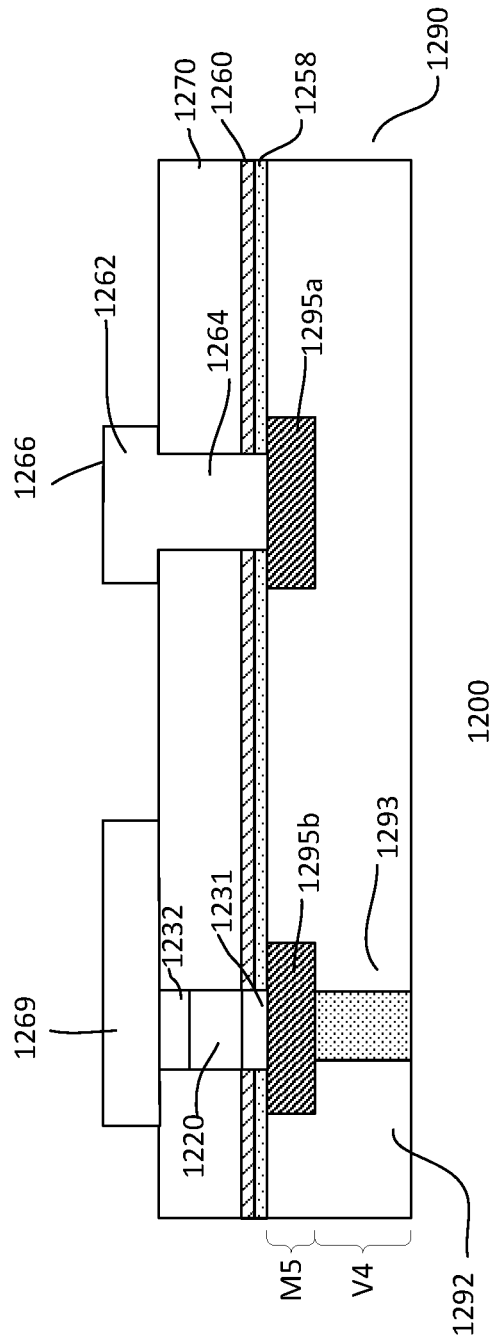

An intermediate dielectric layer 1270 which serves as a storage dielectric layer is formed on the substrate, as shown in FIG. 9e. The dielectric layer is formed over the lower dielectric layer 1260 and sufficiently covers the pMTJ stack. The intermediate dielectric layer, for example, is silicon oxide. Other types of intermediate dielectric layers may also be useful. The intermediate dielectric layer may be formed by CVD. Other techniques for forming the dielectric layer may also be useful.

A planarizing process is performed on the substrate, planarizing the intermediate dielectric layer. The planarizing process, for example, is a CMP process. The CMP process produces a planar top surface between the top of the pMTJ stack and the intermediate dielectric layer. The intermediate dielectric layer is patterned to form a via opening 1276. The via opening is patterned by mask and etch techniques. The via opening penetrates through the various dielectric layers and the dielectric liner. This exposes the interconnect 1295a in the lower metal level. After forming the via opening, the mask layer is removed. For example, the mask and ARC layers are removed.

A conductive layer is formed on the substrate. The conductive layer covers the intermediate dielectric layer and pMTJ stack as well as fills the via opening. The conductive layer should be sufficiently thick to serve as a metal line or an interconnect. The conductive layer, for example, includes a copper layer. Other suitable types of conductive layers may also be useful. The conductive layer may be formed by, for example, sputtering. Other suitable techniques for forming the conductive layer may also be useful.

The conductive layer is patterned to form a metal line 1269 and an interconnect 1266. Patterning the conductive layer to form the metal line and interconnect may be achieved by mask and etch techniques. For example, a patterned photoresist mask (not shown) may be formed over the conductive layer. An etch, such as RIE, may be used to pattern the conductive layer with a patterned resist mask. In one embodiment, the interconnect 1266 includes a via contact 1264 in the via opening and a contact 1262 over the intermediate dielectric layer 1270. The metal line 1269, for example, may serve as the BL. After patterning the conductive layer, the mask layer is removed. For example, the mask and ARC layers are removed.

Additional processes may be performed to complete the formation of the device. For example, the processes may include forming additional ILD levels, pad level, passivation level, pad opening, dicing, assembly and testing. Other types of processes may also be performed.

Although the storage stack of the memory cell as described above includes a pMTJ stack such as that shown in FIGS. 3*a-d*, 4*a-b*, 6*a-b* and 7, it is understood that other suitable configurations and other types of pMTJ stack may be used. In addition, the process as described in FIGS. 9*a-e* is also applicable to other suitable types of memory cell, such as but not limited to memory cells which are sensitive to high temperature processing.

The embodiments as described result in various advantages. As discussed above, a pMTJ stack with a free layer using crystalline based material (e.g. crystalline CoFe) for an embedded MRAM is compatible with high temperature, for example, reflow temperature at 260° C., without increasing the chip size and causing extra power consumption. In addition, the interface engineering between the tunneling barrier layer and free layer can further enhance Eb and improve the stability of the pMTJ stack. Better data retention at high temperature can be achieved by the proposed storage layers design for pMTJ stacks with current STT-MRAM technology using conventional equipment. The various embodiments may serve as an option to design MRAM for embedded memory devices where high retention of information at reflow temperature or automotive grade is required.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

The invention claimed is:

1. A method of forming a device, the method comprising:
   forming a back-end-of-line dielectric layer; and
   forming a bottom electrode over the back-end-of-line dielectric layer;
   forming a magnetic fixed layer of a perpendicular magnetic tunnel junction stack on the bottom electrode;
   forming a first tunneling barrier layer over the magnetic fixed layer;
   forming a first magnetic free layer over the first tunneling barrier layer, the first magnetic free layer comprised of a first alloy containing iron, cobalt, and boron;
   forming a second magnetic free layer over the first magnetic free layer, the second magnetic free layer comprised of a second alloy containing iron, cobalt, and boron; and
   forming a top electrode over the second magnetic free layer,
   wherein the first magnetic free layer has a first content of boron, the second magnetic free layer has a second content of boron that is greater than the first content of boron in the first magnetic free layer, the first magnetic free layer and the second magnetic free layer constitute a composite magnetic free layer, and a first interface layer is formed between the first tunneling barrier layer and the composite magnetic free layer.

2. The method of claim 1 further comprising:
   forming a spacer layer between the first magnetic free layer and the second magnetic free layer.

3. The method of claim 2 wherein the spacer layer is comprised of a non-magnetic metal.

4. The method of claim 1 wherein the first interface layer is comprised of magnesium oxide doped with aluminum.

5. The method of claim 1 further comprising:
   forming a second tunneling barrier layer over the composite magnetic free layer; and
   forming a second interface layer between the second tunneling barrier layer and the composite magnetic free layer.

6. The method of claim 5 wherein the first interface layer and the second interface layer are each comprised of magnesium oxide doped with aluminum.

* * * * *